(12) United States Patent
Miyaaki

(10) Patent No.: US 11,415,624 B2
(45) Date of Patent: Aug. 16, 2022

(54) SOCKET FOR INSPECTION

(71) Applicant: Yamaichi Electronics Co., Ltd., Tokyo (JP)

(72) Inventor: Junichi Miyaaki, Tokyo (JP)

(73) Assignee: YAMAICHI ELECTRONICS CO., LTD., Tokyo (JP)

( * ) Notice: Subject to any disclaimer, the term of this patent is extended or adjusted under 35 U.S.C. 154(b) by 128 days.

(21) Appl. No.: 17/047,625

(22) PCT Filed: Jan. 31, 2019

(86) PCT No.: PCT/JP2019/003405
§ 371 (c)(1),
(2) Date: Oct. 14, 2020

(87) PCT Pub. No.: WO2020/157921
PCT Pub. Date: Aug. 6, 2020

(65) Prior Publication Data
US 2021/0148970 A1    May 20, 2021

(51) Int. Cl.
*H01R 13/625*    (2006.01)
*G01R 31/28*    (2006.01)
*H01L 23/32*    (2006.01)
*H01R 12/88*    (2011.01)

(52) U.S. Cl.
CPC .......... *G01R 31/2887* (2013.01); *H01L 23/32* (2013.01); *H01R 12/88* (2013.01)

(58) Field of Classification Search
CPC ...... H01R 12/88; H01L 23/32; G01R 31/2887
USPC ........................................... 439/342
See application file for complete search history.

(56) References Cited

U.S. PATENT DOCUMENTS

| | | | |
|---|---|---|---|
| 4,463,217 A * | 7/1984 | Orcutt ................ | H01L 23/057 174/556 |
| 4,836,861 A * | 6/1989 | Peltzer ................ | H01L 31/061 136/246 |
| 5,463,248 A | 10/1995 | Yano et al. | |

(Continued)

FOREIGN PATENT DOCUMENTS

| | | |
|---|---|---|
| JP | H05-191028 A | 7/1993 |
| JP | H06-085142 A | 3/1994 |

(Continued)

OTHER PUBLICATIONS

International Search Report and Written Opinion for Intl Application No. PCT/JP2019/003405, titled: Socket for Inspection, dated Apr. 10, 2019.

*Primary Examiner* — Abdullah A Riyami
*Assistant Examiner* — Vladimir Imas
(74) *Attorney, Agent, or Firm* — Hamilton, Brook, Smith & Reynolds, P.C.

(57) ABSTRACT

An IC socket (2) includes a first contact terminal (15a) that contacts a gull wing type lead terminal (1b) of an IC device (1), a second contact terminal that contacts a J-type lead terminal, a cam portion (3d) and a sliding portion (15c5) for bringing the first contact terminal (15a) into contact with the gull wing type lead terminal (1b), and a latch (6) for bringing the second contact terminal into contact with the J-type lead terminal. An asynchronous operation in which a contact operation by the cam portion (3d) and the sliding portion (15c5) is performed after a contact operation by the latch (6) is performed.

14 Claims, 18 Drawing Sheets

(56) References Cited

U.S. PATENT DOCUMENTS

| | | | | |
|---|---|---|---|---|
| 5,557,145 | A * | 9/1996 | Kobayashi | H01L 23/32 257/692 |
| 5,563,773 | A | 10/1996 | Katsumata | |
| 7,053,496 | B2 * | 5/2006 | Stone | H01L 23/49811 257/E23.068 |
| 7,204,708 | B2 * | 4/2007 | Sato | G01R 1/0466 439/259 |
| 7,210,953 | B2 * | 5/2007 | Hayakawa | H05K 7/1069 439/331 |
| 7,214,084 | B2 * | 5/2007 | Hayakawa | H05K 7/1084 439/268 |
| 7,275,938 | B2 * | 10/2007 | Nakano | G01R 1/0483 439/71 |
| 7,413,458 | B2 * | 8/2008 | Miyaaki | G01R 1/0466 439/331 |
| 7,429,497 | B2 * | 9/2008 | Stone | H01L 23/49811 257/E23.068 |
| 7,775,821 | B2 * | 8/2010 | Hsu | H05K 7/1046 439/266 |
| 9,945,903 | B2 * | 4/2018 | Ishii | H01L 23/49541 |
| 10,225,932 | B1 * | 3/2019 | Simula | H05K 1/185 |
| 11,244,882 | B2 * | 2/2022 | Hachuda | G01R 1/0433 |
| 2004/0262725 | A1 | 12/2004 | Stone | |
| 2006/0166401 | A1 | 7/2006 | Stone | |
| 2007/0264846 | A1 | 11/2007 | Takagi | |
| 2021/0341533 | A1 * | 11/2021 | Kobayashi | H01R 33/76 |

FOREIGN PATENT DOCUMENTS

| | | |
|---|---|---|
| JP | H06-224354 A | 8/1994 |
| JP | H07-022572 A | 1/1995 |
| JP | H09-045811 A | 2/1997 |
| JP | 10-312871 A | 11/1998 |
| JP | H11-233709 A | 8/1999 |
| JP | 2005-174670 A | 6/2005 |
| JP | 2007-149514 A | 6/2007 |
| JP | 2007-304051 A | 11/2007 |
| JP | 2009-158384 A | 7/2009 |
| WO | WO 2020/157921 A1 | 8/2020 |

* cited by examiner

SOCKET FOR INSPECTION

This application is the U.S. National Stage of International Application No. PCT/JP2019/003405, filed on Jan. 31, 2019, which designates the U.S., published in Japanese. The entire teachings of the above application are incorporated herein by reference.

TECHNICAL FIELD

The present invention relates to a socket for inspection to be used, for example, when an IC package having an IC chip enclosed therein is inspected, and more specifically to an open top type IC socket for inspecting an IC package having different types of lead terminals.

BACKGROUND ART

Generally, in a semiconductor device, an IC chip serving as a core is enclosed in a package made of synthetic resin in order to protect the IC chip from the outside. Therefore, the semiconductor device is provided with a terminal portion for electrically connecting the IC chip and an external connection device. Various forms are prepared for this terminal portion according to a package mounting method. As an example, Patent Literatures 1 and 2 disclose QFP (Quad Flat Package) type semiconductor devices. The QFP type semiconductor device is a surface mount type semiconductor package in which lead terminals are drawn out from four side surfaces of the package, and has J-shaped J-type lead terminals (Patent Literature 1) or L-shaped gull wing type (Patent Literature 2).

As IC chips become smaller in size and higher in performance, semiconductor devices themselves are required to be miniaturized. However, when semiconductor devices are miniaturized, it will inevitably cause a problem in that lead terminals are higher in density. However, since there is a physical limit to increasing the density of lead terminals, a hybrid type semiconductor device in which plural types of lead terminals are combined in one package has recently been proposed (for example, see Patent Literatures 3 to 5). According to the aforementioned semiconductor device, lead terminals can be arranged at high density in one package, so that the semiconductor device can be downsized and the performance thereof can be improved.

Further, semiconductor devices are subjected to an operation inspection such as a burn-in test and an electric characteristic inspection after products are completed. Usually, this operation inspection is carried out using a dedicated jig (IC socket). For example, Patent Literature 6 discloses an example of an IC socket for a semiconductor package having gull wing type lead terminals, and Patent Literature 7 discloses an example of an IC socket for a semiconductor package having J-type lead terminals.

CITATION LIST

Patent Literature

[PTL 1] Japanese Unexamined Patent Application, Publication No. Hei-5-191028
[PTL 2] Japanese Unexamined Patent Application, Publication No. Hei-7-022572
[PTL 3] Japanese Unexamined Patent Application, Publication No. Hei-6-224354
[PTL 4] Japanese Unexamined Patent Application, Publication No. Hei-6-085142
[PTL 5] Japanese Unexamined Patent Application, Publication No. Hei-11-233709
[PTL 6] Japanese Unexamined Patent Application, Publication No. 2007-149514
[PTL 7] Japanese Unexamined Patent Application, Publication No. 2009-158384

SUMMARY OF INVENTION

Technical Problem

However, there is the following technical problem in testing the hybrid type semiconductor device described above. In other words, the contact terminals must be simultaneously brought into contact with the lead terminals which are different in drawing form among respective types, thereby surely achieving conduction with the lead terminals.

Therefore, in order to solve the above-mentioned problem, the present invention has an object to provide a socket for inspection that is capable of surely achieving the conduction between lead terminals and contact terminals when simultaneously inspecting a hybrid type semiconductor package having different types of lead terminals by one inspection operation.

Solution to Problem

A socket for inspection according to an aspect of the present invention comprises: a first contact terminal that is configured to be in contact with a first lead terminal of an inspection device; a second contact terminal that is configured to be in contact with a second lead terminal of the inspection device, the second lead terminal being different in type from the first lead terminal; a first contact mechanism that is configured to bring the first contact terminal into contact with the first lead terminal; a second contact mechanism that is configured to bring the second contact terminal into contact with the second lead terminal; and an asynchronous mechanism that is configured to perform an asynchronous operation in which a contact operation by the first contact mechanism is performed after a contact operation by the second contact mechanism.

The asynchronous mechanism causes the contact operation by the first contact mechanism to be performed after the contact operation by the second contact mechanism. This makes it possible to bring the first contact terminal into contact with the first lead terminal after the second contact terminal is brought into contact with the second lead terminal to surely ensure the conduction. Therefore, even if the first lead terminal and the second lead terminal are different types of lead terminals, it is possible to surely achieve conduction for the respective lead terminals.

Note that the contact operation does not include a case where the contact terminal is simply touching the lead terminal, but means a contact state equivalent to a state under inspection. For example, in a case where a contact state equivalent to the state under inspection is obtained only after the contact terminal touches the lead terminal and then the contact terminal is pushed, it means that the contact operation has been performed after the pushing. In a case where a contact state equivalent to the state under inspection is not obtained unless a state where the lead terminal has been pinched is obtained, it means that the contact operation has been performed after the pinching.

The inspection device is typically a semiconductor package, more specifically an IC package.

In the socket for inspection according to the aspect of the present invention, the asynchronous mechanism releases the contact by the first contact mechanism before releasing the contact by the second contact mechanism.

The contact by the first contact mechanism is released before the contact by the second contact mechanism is released. This makes it possible to first release the contact state between the first lead terminal and the first contact terminal under the state where the second contact terminal is in contact with the second lead terminal. Therefore, it can be prevented as much as possible to damage the respective terminals when the contact state is released.

The socket for inspection according to one aspect of the present invention further comprises: a base that is provided on a mount side on which the inspection device is accommodated; a first cover that is provided so as to approach to and move away from the base; and a second cover that is provided so as to approach to and move away from the base independently of the first cover, wherein the first contact mechanism and the second contact mechanism are driven according to movements of the first cover and the second cover.

The first contact mechanism and the second contact mechanism are operated by the first cover and the second cover that approach to and move away from the base. As a result, the contact operations of the first contact terminal and the second contact terminal can be performed in conjunction with the movements of the first cover and the second cover, and an inspection based on a simple operation can be realized.

In the socket for inspection according to one aspect of the present invention, the first cover includes a second cover accommodating portion that is configured to accommodate the second cover therein.

The second cover can reciprocate while accommodated in the second cover accommodation portion provided to the first cover. As a result, the first cover and the second cover can be configured to be compact in size.

The socket for inspection according to one aspect of the present invention further comprises a latch reciprocating between a press position where a back surface opposite to a mount surface of the inspection device is pressed in a direction to the mount surface, and a separation position where the latch is separated from the inspection device, wherein according to the movement of the first cover and/or the second cover, the latch is located at the press position when the inspection device is inspected, and is located at the separation position when the inspection device is mounted or taken out.

The back surface of the inspection device is pressed by the latch, whereby the contact of the contact terminal can be surely obtained under inspection. Further, when the inspection device is mounted or taken out, a work of replacing the inspection device can be facilitated by separating the latch from the inspection device. Further, since the latch is driven according to the movement of the first cover and/or the second cover, an inspection work can be simplified.

In the socket for inspection according to one aspect of the present invention, the latch is operated by the second cover, and the second contact mechanism performs a contact operation upon placement of the latch at the press position.

As the second contact mechanism, the press operation of the latch is performed by the second cover to bring the second contact terminal into contact with the second lead terminal. Since the second cover can move with respect to the base independently of the first cover, an asynchronous mechanism for the first contact mechanism and the second contact mechanism can be realized.

The second lead terminal may include, for example, a J-type lead terminal provided around the back surface side of the inspection device.

In the socket for inspection according to one aspect of the present invention, the latch releases the contact between the second lead terminal and the second contact terminal upon placement of the latch at the separation position.

When the second cover moves, the retreating operation of the latch releases the contact between the second lead terminal and the second contact terminal. Accordingly, the contact of the second lead terminal can be easily released in conjunction with the movement of the second cover.

In the socket for inspection according to one aspect of the present invention, the first contact terminal includes a one-surface-side contact portion configured to be in contact with one surface side of the first lead terminal, an other-surface-side contact portion configured to be in contact with another surface side of the first lead terminal, and an arm portion that is configured to cause the other-surface-side contact portion to approach the one-surface-side contact portion so as to pinch the first lead terminal, wherein the first cover includes a cam portion that contacts the arm portion and regulates movement of the arm portion, and the first contact mechanism performs a contact operation by the arm portion operating according to the cam portion in connection with movement of the first cover with respect to the base.

The cam portion is provided to the first cover that approaches to and moves away from the base, and the first contact terminal having the arm portion whose operation is regulated by the cam portion is provided. When the arm portion operates, the other-surface-side contact portion driven by the arm portion approaches the one-surface-side contact portion. As a result, the first lead terminal can be pinched by the one-surface-side contact portion and the other-surface-side contact portion, and a good contact state can be obtained.

The first lead terminal may include, for example, a gull wing type lead terminal extending to a side of the inspection device.

In the socket for inspection according to one aspect of the present invention, the arm portion is driven so that the other-surface-side contact portion which pinches the first lead terminal is moved away from the one-surface-side contact portion, thereby releasing the contact, and the first contact mechanism releases the contact by the arm portion operating according to the cam portion in connection with movement of the first cover with respect to the base.

When the arm portion operates according to the cam portion, the other-surface-side contact portion driven by the arm portion is moved away from the one-surface-side contact portion. As a result, the other-surface-side contact portion can be smoothly separated from the first lead terminal.

In the socket for inspection according to one aspect of the present invention, the cam portion includes a movement resistance portion that is configured to increase a movement resistance of the arm portion operating in contact with the cam portion, and the asynchronous mechanism causes the asynchronous operation to be performed upon contact of the arm portion with the movement resistance portion.

The operation of the arm portion is temporarily delayed when the arm portion for operating the other-surface-side contact portion of the first contact terminal comes into contact with the movement resistance portion provided to the cam portion. As a result, an asynchronous operation in which the contact operation by the first contact mechanism is performed after the contact operation by the second contact mechanism is realized.

The movement resistance portion may include, for example, an engagement portion having a convex shape, a friction portion having increased friction resistance or the like.

In the socket for inspection according to one aspect of the present invention, the cam portion includes a first cam portion that is configured to regulate an operation in which the other-surface-side contact portion approaches to or moves away from the one-surface-side contact portion, and a second cam portion that is configured to regulate an operation in which a state where the other-surface-side contact portion is separated from the one-surface-side contact portion is kept, the movement resistance portion being interposed between the first cam portion and the second cam portion.

The first cam portion and the second cam portion are provided with the movement resistance portion being interposed therebetween, and the first cam portion is adapted to regulate the operation in which the other-surface-side contact portion approaches to or moves away from the one-surface-side contact portion, and the second cam portion is adapted to regulate the operation of keeping the state where the other-surface-side contact portion is separated from the one-surface-side contact portion. As a result, the open state and the closing operation of the other-surface-side contact portion can be clearly separated from each other, and the asynchronous operation can be reliably performed.

The socket for inspection according to one aspect of the present invention further comprises a first terminal latch configured to press the first contact terminal so as to bring the first contact terminal into contact with the first lead terminal according to movement of the first cover, wherein the first terminal latch serves as the first contact mechanism to bring the first contact terminal into contact with the first lead terminal.

As the first contact mechanism, the pressing operation of the first terminal latch is performed by the first cover to bring the first contact terminal into contact with the first lead terminal. Since the first cover can move with respect to the base independently of the second cover, an asynchronous mechanism for the first contact mechanism and the second contact mechanism can be realized.

In the socket for inspection according to one aspect of the present invention, the first terminal latch releases the contact between the first lead terminal and the first contact terminal according to the movement of the first cover.

When the first cover moves, the retreating operation of the first terminal latch releases the contact between the first lead terminal and the first contact terminal. As a result, the contact of the first lead terminal can be easily released in conjunction with the movement of the first cover.

Advantageous Effects of Invention

According to the present invention, contact terminals can be surely brought into contact with lead terminals of a hybrid type semiconductor package having different types of lead terminals, and inspection can be completed by only one inspection operation.

DESCRIPTION OF EMBODIMENTS

First Embodiment

A first embodiment of the present invention will be described below.

Figure 1A:
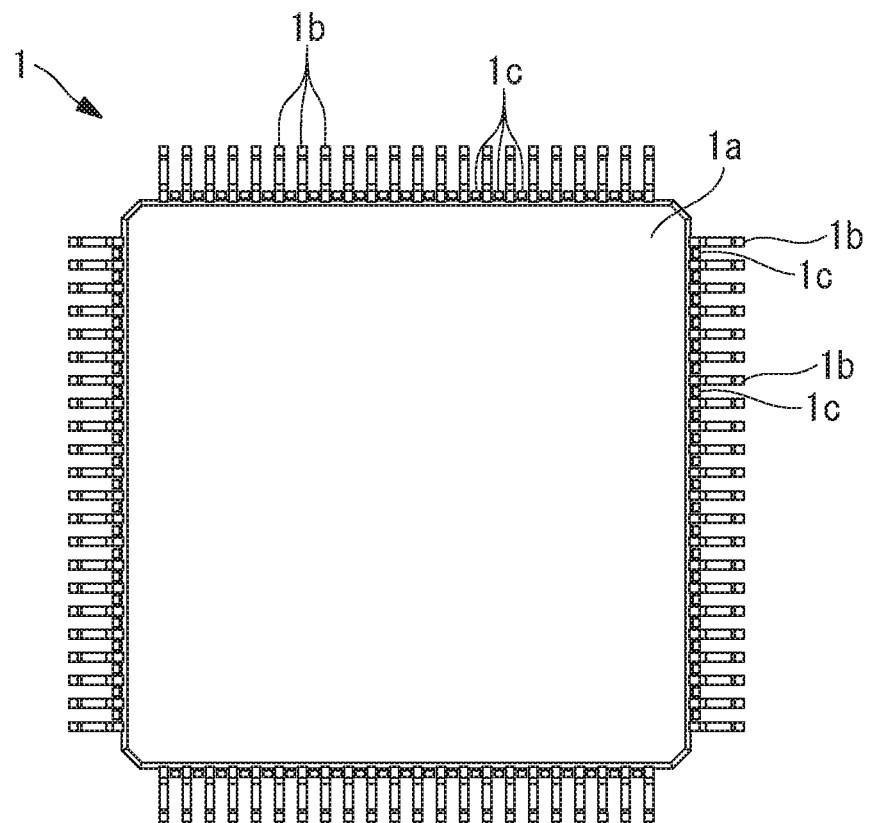
FIG. 1A is a plan view of an IC package.
Figure 1B:
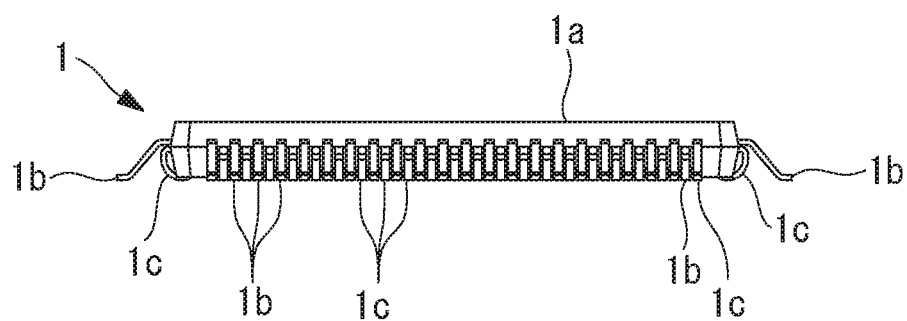
FIG. 1B is a side view of the IC package of FIG. 1A.

FIGS. 1A and 1B show an IC device (inspection device) 1 to be inspected by using an IC socket (socket for inspection) according to the present embodiment. The IC device 1 has an IC chip enclosed therein, and has a package main body 1a that has a square shape when seen in plan view. The IC device 1 is configured as QFP (Quad Flat Package) type, and provided with a plurality of lead terminals 1b and 1c on each of four sides of the package main body 1a. The L-shaped gull wing type lead terminals (first lead terminals) 1b are provided so as to extend outwards orthogonally to each side of the package main body 1a. The respective gull wing type lead terminals 1b are arranged in parallel to one another at a predetermined interval. The J-shaped J-type lead terminals (second lead terminals) 1c are arranged at a predetermined interval so as to be interposed between the gull wing type lead terminals 1b. As described above, the gull wing type lead terminals 1b and the J-type lead terminals 1c are provided alternately.

Figure 2:
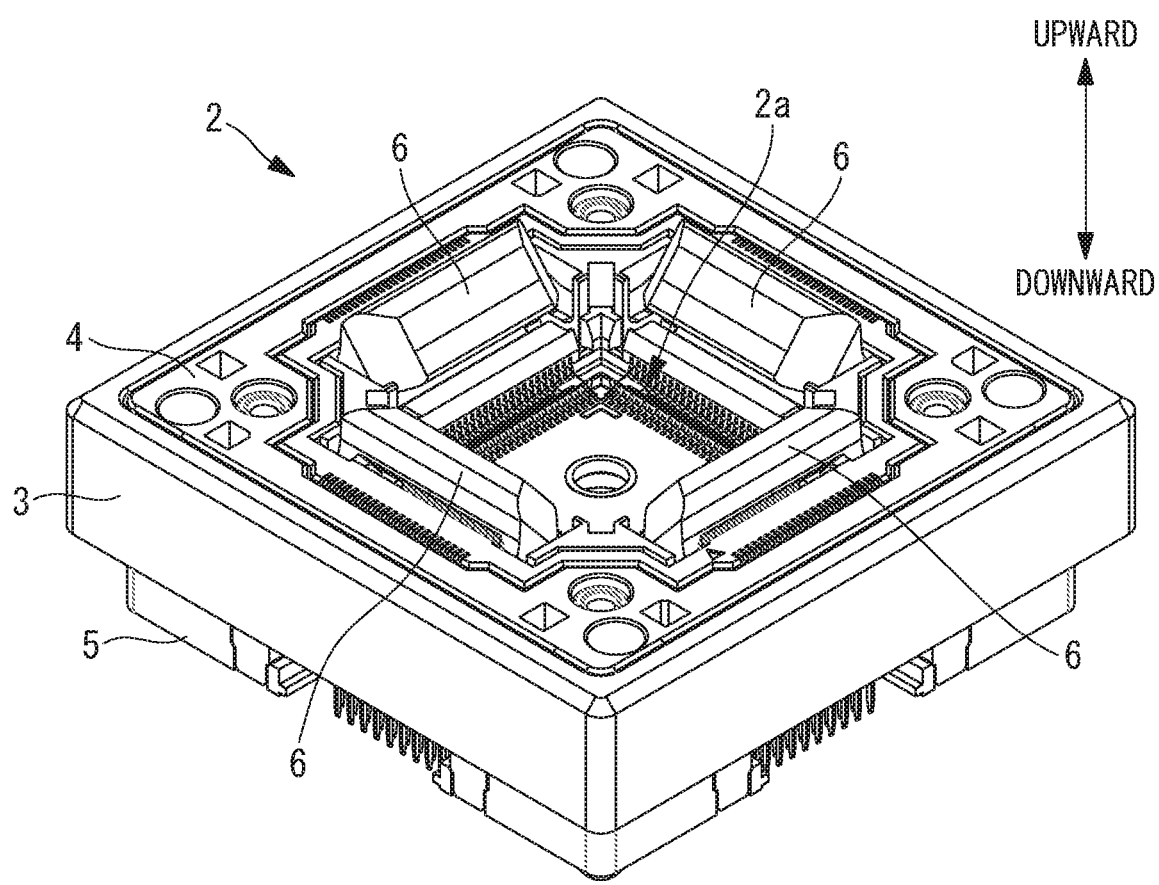
FIG. 2 is a perspective view showing an IC socket according to a first embodiment of the present invention.

FIG. 2 shows an IC socket 2 according to the present embodiment.

Note that in the present embodiment, "upward" means a direction away from an inspection board (not shown) on which the IC socket 2 is mounted, and "downward" means a direction toward the inspection board.

The IC socket 2 is configured in a rectangular parallelepiped shape which is substantially square when seen in plan view. An accommodating recess portion 2a in which the IC device 1 is accommodated under inspection is formed at the center of the IC socket 2.

The IC socket 2 includes one first cover 3 forming an outer frame, and one second cover 4 to be accommodated inside the first cover 3. The first cover 3 and the second cover 4 are provided on a base 5.

The first cover 3 is configured to have an outer shape which is substantially square when seen in plan view, and have an opening therein. The first cover 3 is capable of reciprocating in an up-and-down direction so as to approach to and move away from the base 5.

The second cover 4 is configured to have an outer shape which is substantially square so that it is accommodated inside the first cover 3, and have an opening therein. The second cover is capable of reciprocating in an up-and-down direction with respect to the base 5 independently of the first cover 3.

The base 5 is located below the IC socket 2, and serves as a base stand for the IC socket 2. The base 5 has a lower surface to be mounted on the inspection board (not shown).

Four latches 6 are provided on the center side of the first cover 3 and the second cover 4. Each latch 6 is provided so as to correspond to each side of the first cover 3 and the second cover 4. Each latch 6 operates so as to push the back surface (upper surface) of the IC device 1 downward when the IC device 1 is placed in the accommodating recess portion 2a. As a result, the IC device 1 is securely fixed.

Note that the number of latches 6 is not limited to four in the present embodiment, and may be two which are provided at opposing positions, for example.

Figure 3:
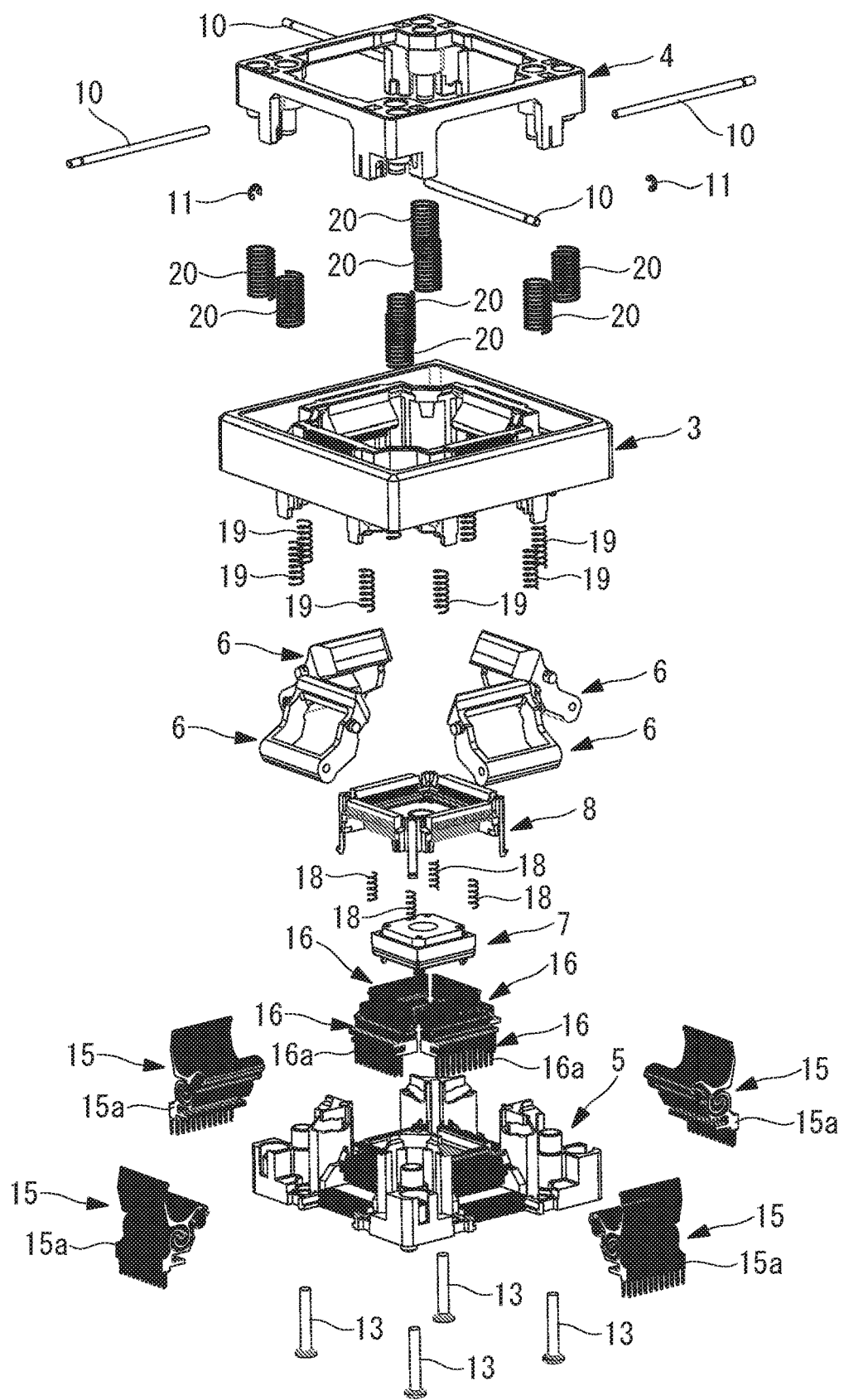
FIG. 3 is an exploded perspective view of the IC socket of FIG. 2.

FIG. 3 is an exploded perspective view of the IC socket 2.

A support plate 7 and a mounter 8 are assembled in order on the lower-side base 5, and the first cover 3 and the second cover 4 are assembled on the base 5 so as to surround the support plate 7 and the mounter 8.

Each latch 6 is attached to the second cover 4 via a latch pin 10. The latch pin 10 is a rod-shaped shaft body. The latch 6 is attached so as to rotate around the latch pin 10. Reference sign 11 indicates an E-ring for rotatably fixing the latch pin 10 to the second cover 4.

Four rivets 13 are arranged to be inserted from below the base 5. The rivet 13 is a fixture that relatively fixes the base 5 and the second cover 4, and the distance between the base 5 and the second cover 4 in a height direction in a free state is positionally determined by the rivets 13.

In the base 5, four first contact terminal groups 15 are inserted from the outer sides of the four sides of the base 5, respectively. Each of the first contact terminal groups 15 is configured by arranging a plurality of first contact terminals 15a in parallel to one another. Each of the first contact terminals 15a is used as a terminal which comes into contact with each gull wing type lead terminal 1b shown in FIGS. 1A and 1B, thereby achieving conduction with the gull wing type lead terminal 1b.

In the base 5, four second contact terminal groups 16 are inserted so as to face the respective first contact terminal groups 15 from the inner side of the base 5. Each of the second contact terminal groups 16 is configured by arranging a plurality of second contact terminals 16a in parallel to one another. Each of the second contact terminals 16a is used as a terminal which is to be brought into contact with each J-type lead terminal 1c shown in FIGS. 1A and 1B, thereby achieving conduction with the J-type lead terminal 1c.

A plurality of (four in the present embodiment) pedestal coil springs 18 are provided below the mounter 8. Each pedestal coil spring 18 is used to urge the mounter 8 upward with respect to the base 5.

A plurality of (eight in the present embodiment) first coil springs 19 are provided below the first cover 3. Each of the first coil springs 19 is used to urge the first cover 3 upward with respect to the base 5.

A plurality of (eight in this embodiment) second coil springs 20 are provided below the second cover 4. Each of the second coil springs 20 is used to urge the second cover 4 upward with respect to the base 5.

<Base 5>

Figure 4A:
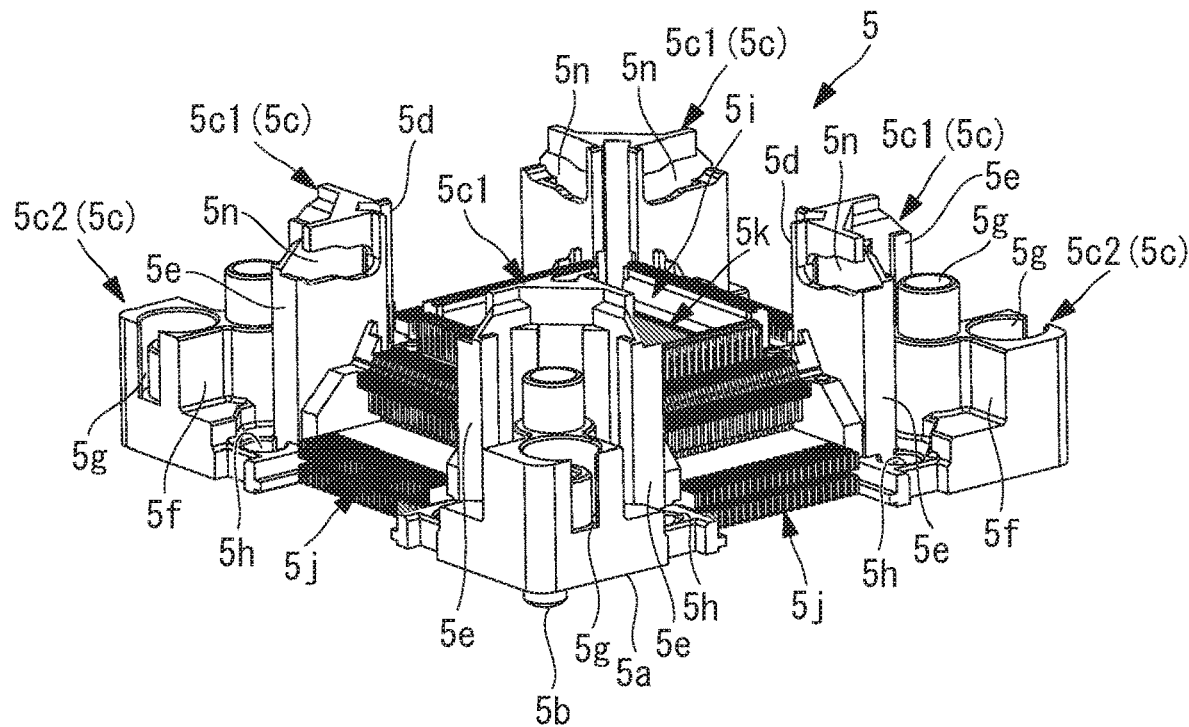
FIG. 4A is a perspective view of a base of FIG. 3.
Figure 4B:
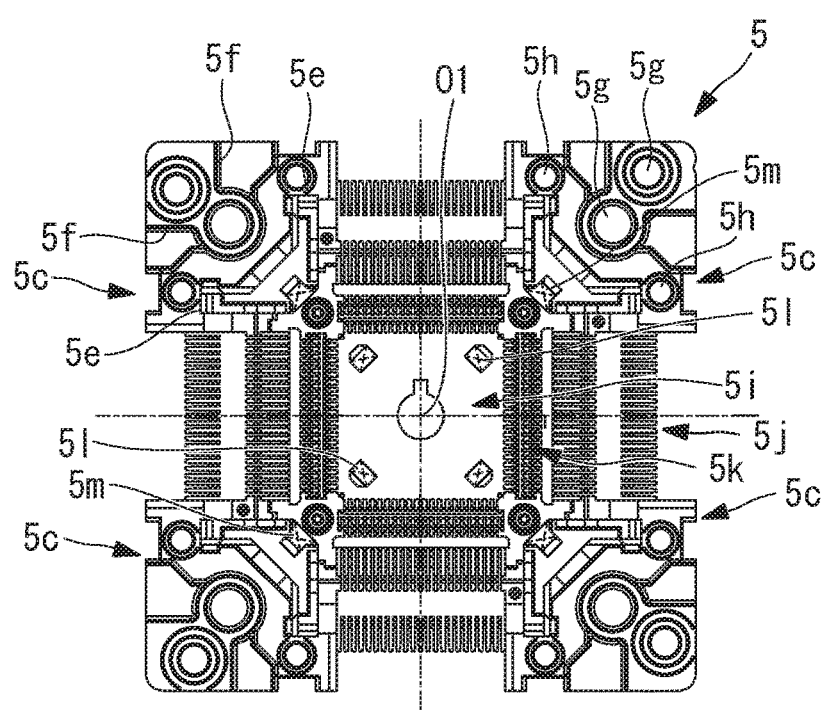
FIG. 4B is a plan view of the base of FIG. 3.

The base 5 is shown in FIGS. 4A and 4B.

The base 5 is a molded product of synthetic resin and has an outer shape which is substantially square when seen in plan view. The bottom of the base 5 is provided with a flat mounting surface 5a to be mounted on an inspection board (not shown). Projections 5b for positioning are provided at the four corners of the mounting surface 5a.

Columnar guide portions 5c which are upright upward are provided at four corners of the base 5. Each of the guide portions 5c includes an inner guide portion 5c1 that is substantially L-shaped when seen in plan view, and outer guide portions 5c2 arranged at the four corners of the base 5. The inner guide portions 5c1 are symmetrically arranged so that L-shaped top portions 5d thereof face a center O1 (see FIG. 4B) of the base 5. Each of the outer surfaces 5e of the inner guide portions 5c1 guides the reciprocating movement of the first cover 3 in the up-and-down direction. The outer guides 5c2 are provided to be upright from the four corners of the base 5, and the inner surfaces 5f facing inward guide the reciprocating movement of the second cover 4 in the up-and-down direction.

A plurality of first coil spring insertion holes 5g in which the first coil springs 19 (see FIG. 3) are inserted and a plurality of second coil spring insertion holes 5h in which the second coil springs 20 (see FIG. 3) are inserted are formed at outside portions of the guide portions 5c.

A base opening portion 5i is provided on the center O1 side of the base 5, that is, on the inside of each guide portion 5c. The base opening portion 5i is configured to have a square shape when seen in plan view, and serves as a space in which the support plate 7 (see FIG. 3) and the mounter 8 (see FIG. 3) are accommodated.

A first contact holding portion 5j and a second contact holding portion 5k are provided between the adjacent guide portions 5c.

The first contact holding portion 5j is configured by a plurality of slit grooves for holding the first contact terminal group 15 (see FIG. 3). The slit grooves of the first contact holding portion 5j are formed so as to extend from the outside to the inside of the base 5. The slit grooves respectively correspond to the first contact terminals 15a (see FIG. 3). The first contact terminal 15a is held while press-fit in the slit groove.

The second contact holding portion 5k is configured by a plurality of slit grooves for holding the second contact terminal group 16 (see FIG. 3). The slit grooves of the second contact holding portion 5k are formed so as to extend from the inside to the outside of the base 5. The slit grooves respectively correspond to the second contact terminals 16a (see FIG. 3). The second contact terminal 16a is held while press-fit in the slit groove, and is fixed by a sealing piece for retaining (in the present embodiment, the support plate 7 also serves as the sealing piece).

<First Contact Terminal 15a>

Figure 5:
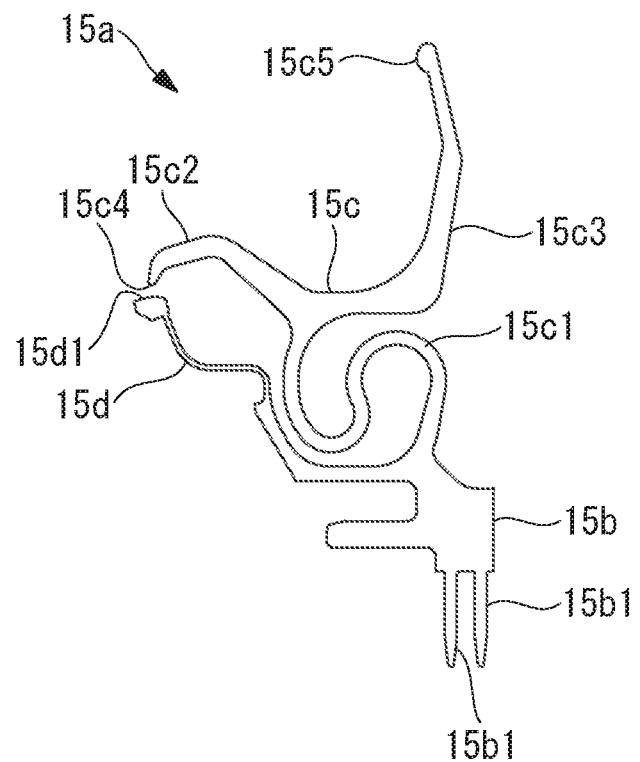
FIG. 5 is a front view showing a first contact terminal of FIG. 3.

FIG. 5 shows the first contact terminal 15a. The first contact terminals 15a are formed of metal having good electric conductivity, and are arranged side by side at a predetermined interval to form the first contact terminal group 15 (see FIG. 3).

The first contact terminal 15a includes a base portion 15b, and an upper contact portion 15c and a lower contact portion 15d that are bifurcated upward from the base portion 15b.

The base portion 15b includes a plurality of (two in the present embodiment) first board-side terminals 15b1 protruding downward. Each of the first board-side terminal 15b1 is electrically connected to the inspection board (not shown).

The upper contact portion 15c includes an eddy portion 15c1 that is continuously connected to the base portion 15b, a contact-side arm portion 15c2 that branches from the eddy portion 15c1 and extends to a left side (to the inside of the IC socket 2) in FIG. 5, and a drive-side arm portion 15c3 that branches from the eddy portion 15c1 and extends upward. The eddy portion 15c1 is formed in an eddy-like shape having a plurality of curved portions, and applies an elastic force to the contact-side arm portion 15c2 and the drive-side arm portion 15c3 with respect to the base portion 15b. A first upper-side contact 15c4 which comes into contact with the upper surface of the gull wing type lead terminal 1b (see FIG. 1) at the lower surface thereof is provided at the tip (left end) of the contact-side arm portion 15c2. A sliding portion 15c5 that slides on a cam portion 3d (see FIG. 10B) described later is provided at the tip (upper end) of the drive-side arm portion 15c3. The sliding portion 15c5 is configured to have a convex curved-surface shape.

The lower contact portion 15d is provided so as to extend leftward (to the inside of the IC socket 2) with respect to the base portion in FIG. 5 and extend obliquely upward so that it approaches the first upper-side contact 15c4. A first lower-side contact 15d1 that comes into contact with the lower surface of the gull wing type lead terminal 1b (see FIG. 1) at the upper surface thereof is provided at the tip (left end) of the lower contact portion 15d. The first lower-side contact 15d1 faces the lower side of the first upper-side contact 15c4. The first lower-side contact 15d1 has a flat surface portion, and the area of the flat surface portion is set to be larger than the area of the first upper-side contact 15c4. The interval distance between the first upper-side contact 15c4 and the first lower-side contact 15d1 changes according to the displacement of the drive-side arm portion 15c3. Under inspection, the gull wing type lead terminal 1b is pinched by the first upper-side contact 15c4 and the first lower-side contact 15d1, so that the first upper-side contact 15c4 and the first lower-side contact 15d1 electrically contact each other to achieve conduction therebetween.

In the present embodiment, in the first contact terminal 15a, both the upper contact portion 15c and the lower contact portion 15d are configured by a single metal plate (electrically conductive member). However, at least one of the upper contact portion 15c and the lower contact portion 15d may be conductive. In other words, one of the contact terminals 15c and 15d may be formed as a conductor while the other of the contact terminals 15d and 15c is formed of synthetic resin or the like, for example, by insert molding, and the lead terminal may be pinched by both of these contact terminals 15c and 15d.

<Second Contact Terminal 16a>

Figure 6:
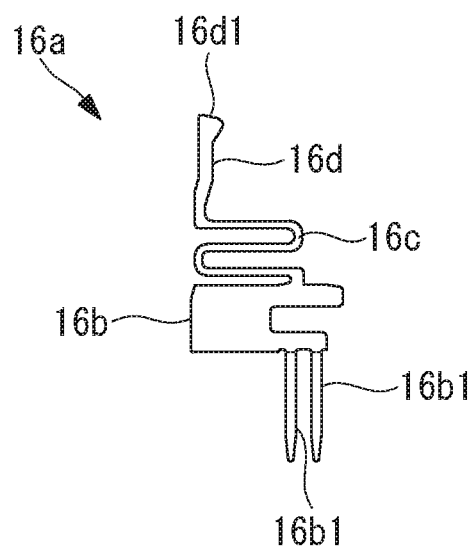
FIG. 6 is a front view showing a second contact terminal of FIG. 3.

FIG. 6 shows the second contact terminal 16a. The second contact terminals 16a are made of metal having good electrical conductivity, and are arranged side by side at a predetermined interval to form the second contact terminal group 16 (see FIG. 3).

The second contact terminal 16a includes a base portion 16b, a meandering portion 16c that is continuously connected to the base portion 16b, and a second contact portion 16d that is continuously connected to the meandering portion 16c.

The base portion 16b includes a plurality of (two in the present embodiment) second board-side terminals 16b1 protruding downward. Each of the second board-side terminals 16b1 is electrically connected to the inspection board (not shown). In the present embodiment, the second board-side terminals 16b1 are provided at two places, and a predetermined terminal pattern is formed by selectively selecting the second board-side terminals 16b1 according to the arrangement order of the second contact terminals 16a.

The meandering portion 16c has a plurality of folded-back portions, and is shaped so that the folded-back portions are meandered upward. The meandering portion 16c applies an elastic force in an up-and-down direction to the second contact portion 16d with respect to the base portion 16b.

The second contact portion 16d extends in the up-and-down direction, and has a second contact 16d1 on the upper surface of the tip (upper end) thereof. Under inspection, the second contact 16d1 comes into contact with the J-type lead terminal 1c (see FIG. 1) to achieve conduction with the J-type lead terminal 1c.

<Support Plate 7>

Figure 7:
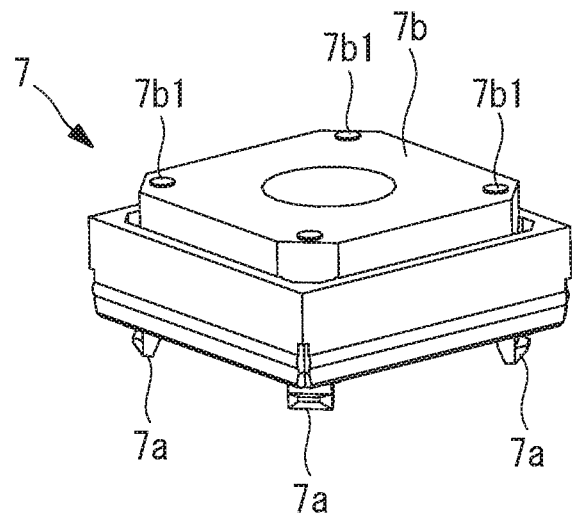
FIG. 7 is a perspective view showing a support plate of FIG. 3.

FIG. 7 shows the support plate 7.

The support plate 7 has an outer shape which is substantially square when seen in plan view. The support plate 7 is accommodated in the base opening portion 5*i* (see FIG. 4B) of the base 5.

Locking claws 7*a* protruding downward are provided to the lower surface of the support plate 7. The locking claws 7*a* are provided at the four corners, respectively. The locking claws 7*a* are adapted to be inserted and fitted in locking holes 5*l* (see FIG. 4B) formed in the bottom surface of the center of the base 5. The support plate 7 is firmly fixed to the base 5 by fitting the locking claws 7*a* in the locking holes 5*l* of the base 5.

The upper surface 7*b* of the support plate 7 is a flat surface, and convex portions 7*b*1 with which the mounter 8 (see FIG. 3) comes into contact are provided at the four corners. The heights of the top surfaces of the respective convex portions 7*b*1 are set so that the top surfaces are flush with one another. In other words, the convex portions 7*b*1 are used as a stopper for the mounter 8 and define a reference surface under inspection.

<Mounter 8>

Figure 8:
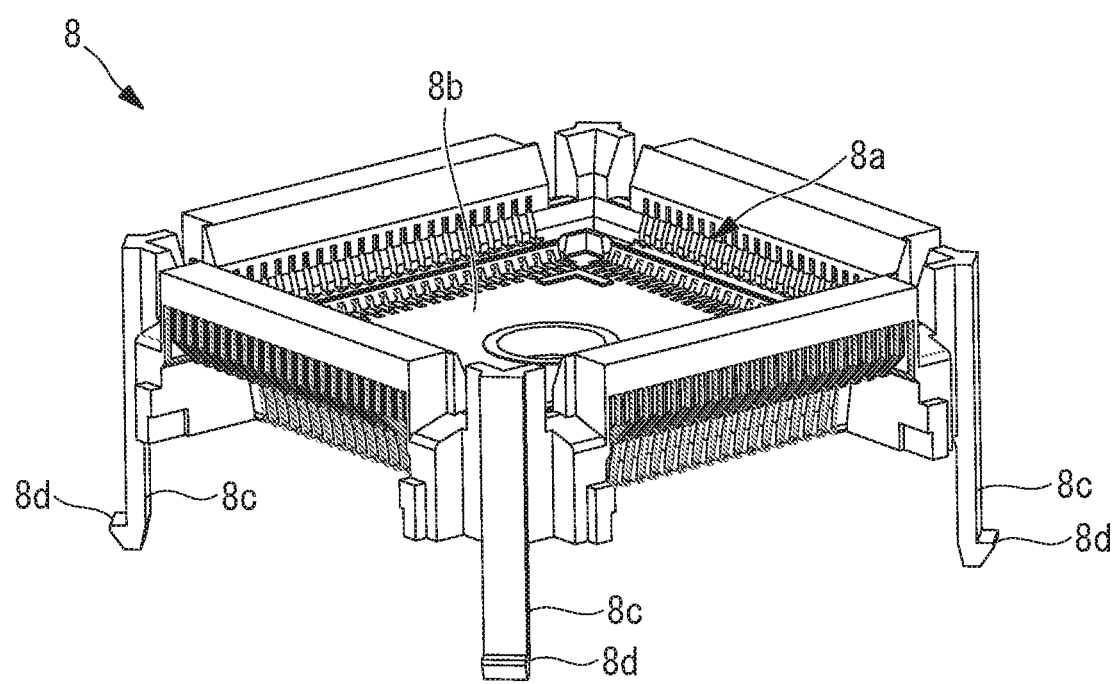
FIG. 8 is a perspective view showing a mounter of FIG. 3.

The mounter 8 is shown in FIG. 8.

The mounter 8 has an outer shape which is substantially square when seen in plan view. The mounter 8 is accommodated in the base opening portion 5*i* (see FIG. 4B) of the base 5, and placed above the support plate 7.

A mounting recess portion 8*a* that opens upward is formed at the center of the mounter 8. The mounting recess portion 8*a* is configured in a substantially square shape corresponding to the outer shape of the IC device 1 (see FIG. 1). The lower end of the mounting recess portion 8*a* is defined by a mounting surface 8*b*. The IC device (see FIG. 1) is inserted into the mounting recess portion 8*a* from above, and placed on the mounting surface 8*b*.

Guide portions 8*c* extending downward are provided at four corners of the mounter 8. A claw portion 8*d* is provided at the tip of the guide portion 8*c*. The guide portions 8*c* are inserted in guide hole portions 5*m* (see FIG. 4B) provided at four places of the base 5. The mounter 8 is capable of reciprocating in the up-and-down direction with respect to the base 5 by inserting each guide portion into the guide hole portion 5*m*.

The mounter 8 is urged upward with respect to the base 5 by the pedestal coil springs 18 (see FIG. 3). In an unloaded state, the mounter 8 is urged upward by the pedestal coil springs 18, resulting in a state where the mounter 8 is separated from the support plate 7. The upper position of the mounter 8 is restricted by the claw portions 8*d* provided to the guide portions 8*c*. The mounter 8 is moved so as to approach the support plate 7 when an external force is applied downward by the latches 6 (see FIG. 3) via the IC device 1, and is stopped in a state where the mounter 8 contacts the support plate 7.

<Latch 6>

Figure 9:
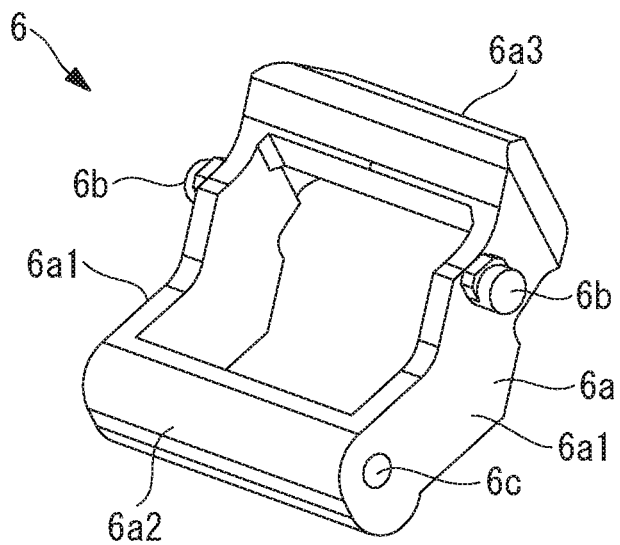
FIG. 9 is a perspective view showing a latch of FIG. 3.

The latch is shown in FIG. 9.

The latch 6 is made of resin, and has a frame body 6*a* having a square shape. The frame body 6*a* includes swing arms 6*a*1 provided on both sides thereof, a guide arm 6*a*2 which is provided so as to connect both the swing arms 6*a*1 at one end (lower end (left end) in FIG. 9) of each of the swing arms 6*a*1, and a press portion 6*a*3 which is provided so as to connect both the swing arms 6*a*1 at the other end (upper end (right end) in FIG. 9) of each of the swing arms 6*a*1.

Shaft portions 6*b* protruding outward are provided on both sides of both the swing arms 6*a*1. The shaft portions 6*b* are inserted into guide groove portions 5*n* (see FIG. 4A) formed in the guide portions 5*c* of the base 5.

A pin insertion hole 6*c* is formed in the guide arm 6*a*2 so as to extend along the longitudinal direction of the guide arm 6*a*2. The latch pin 10 shown in FIG. 3 is inserted into the pin insertion hole 6*c*. By inserting the latch pin 10 into the pin insertion hole 6*c*, the latch 6 is freely turnably fixed in a round hole 4*c* (see FIG. 11) of the second cover 4 (see FIG. 3). When the latch 6 is turned around the latch pin 10, the press portion 6*a*3 swings according to the movement of the shaft portion 6*b*. As described above, the shaft portion 6*b* defines the swinging motion of the press portion 6*a*3 according to the shape of the guide groove portion 5*n*.

The lower surface of the press portion 6*a*3 comes into contact with the upper surface of the IC device 1 (see FIG. 1) to thereby press the IC device 1 downward.

<First Cover 3>

Figure 10A:
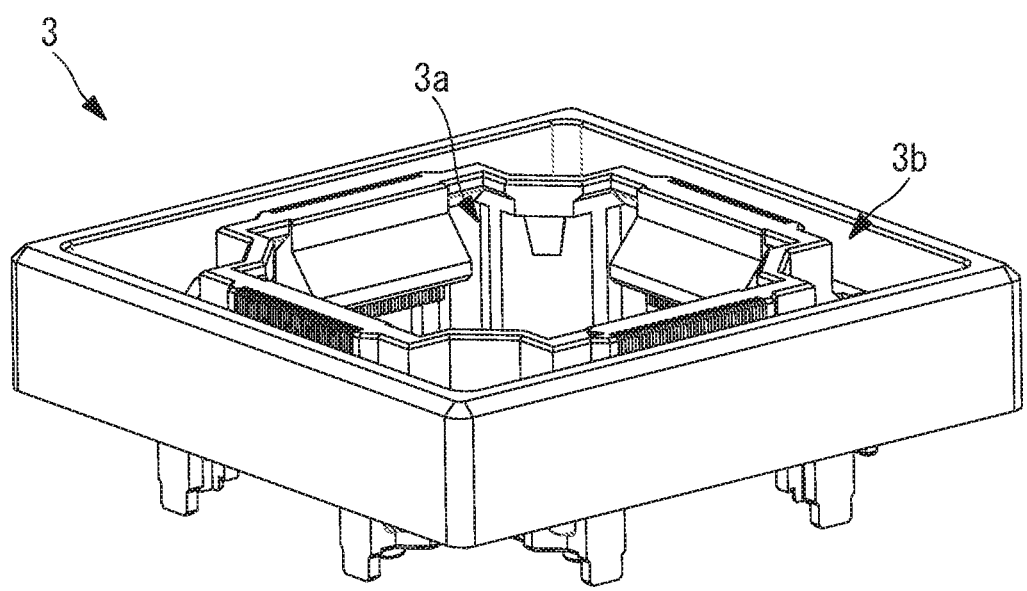
FIG. 10A is a perspective view showing a first cover of FIG. 3.

The first cover 3 is shown in FIG. 10A.

The first cover 3 is made of resin, and has an outer shape which is square when seen in plan view. A square opening portion 3*a* is formed at the center portion of the first cover 3 so as to penetrate therethrough in the up-and-down direction. The IC device 1 (see FIG. 1) is inserted from above and taken out through the opening portion 3*a*. An accommodating recess portion (second cover accommodating portion) 3*b* which is formed in a square shape in plan view is formed so as to surround the opening portion 3*a*. The second cover 4 is allowed to be accommodated in the accommodating recess portion 3*b* from above. The second cover 4 reciprocates in the up-and-down direction in the accommodating recess portion 3*b*.

Further, as described above, the first cover 3 is urged upward from the base 5 by the first coil springs 19.

Figure 10B:
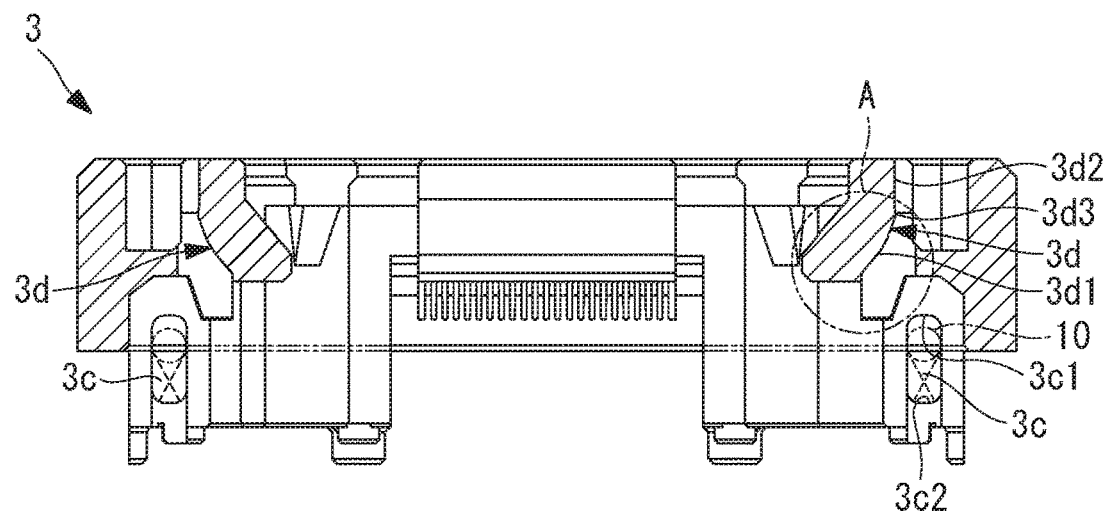
FIG. 10B is a vertically sectional view of the first cover shown in FIG. 3.

FIG. 10B shows a vertically sectional view of the first cover 3. FIG. 10B is a sectional view taken along a cutting line that passes through the center of the first cover 3, and is parallel to one side of the first cover 3. As shown in FIG. 10B, elongated hole portions 3*c* extending in the up-and-down direction are formed on the lower portions on the sides of the first cover 3. The elongated hole portion 3*c* is shaped so as to be closed at an upper end 3*c*1 thereof and a lower end 3*c*2 thereof. The latch pin 10 (see FIG. 3) is inserted into the elongated hole portion 3*c*. Two elongated hole portions 3*c* are provided for one latch pin 10 while being spaced away from each other in the longitudinal direction of the latch pin 10, and guide the latch pin 10 at two locations. As a result, the latch pin 10 is movable in the up-and-down direction in the elongated hole portions 3*c* with respect to the first cover 3.

The first cover 3 is provided with cam portions 3*d* with which the sliding portions 15*c*5 of the first contact terminals 15*a* shown in FIG. 5 come into contact. The cam portions 3*d* are provided along each of the four sides of the first cover 3, and has cam surfaces that face the outside of the first cover 3. The cam portion 3*d* includes a first cam portion 3*d*1 having a curved surface which extends from the lower side to the upper side and is curved in a convex shape so as to protrude to the outside of the first cover 3, and a second cam portion 3*d*2 which is provided above the first cam portion 3*d*1 in a substantially flat shape extending from the lower side to the upper side.

An engaging portion (movement resistance portion) 3*d*3 is provided between the first cam portion 3*d*1 and the second cam portion 3*d*2. The engaging portion 3*d*3 is shaped so as to further protrude to the outside of the first cover 3 from the connection position between the first cam portion 3d1 and the second cam portion 3d2. The engaging portion 3d3 is adapted to apply a movement resistance to the sliding portion 15c5 (see FIG. 5) of the first contact terminal 15a sliding on the cam portion 3d.

Figure 10C:
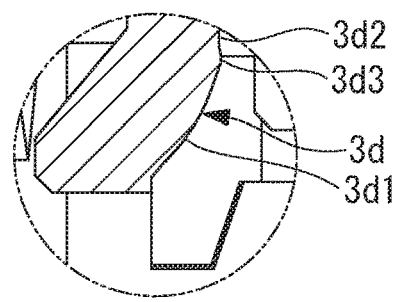
FIG. 10C is an enlarged view of a main part of FIG. 10B.

FIG. 10C shows details of the cam portion 3d, that is, is a partially enlarged view of a main portion A shown in FIG. 10B. As can be seen from FIG. 10C, the engaging portion 3d3 is configured in a convex shape protruding outward from the connection position between the first cam portion 3d1 and the second cam portion 3d2.

As described later, the movement of the sliding portion 15c5 (see FIG. 5) is defined by the cam portion 3d, so that an opening/closing timing between the contacts 15c4 and 15d1 of the first contact terminal 15a (see FIG. 5) is determined.

<Second Cover 4>

Figure 11:
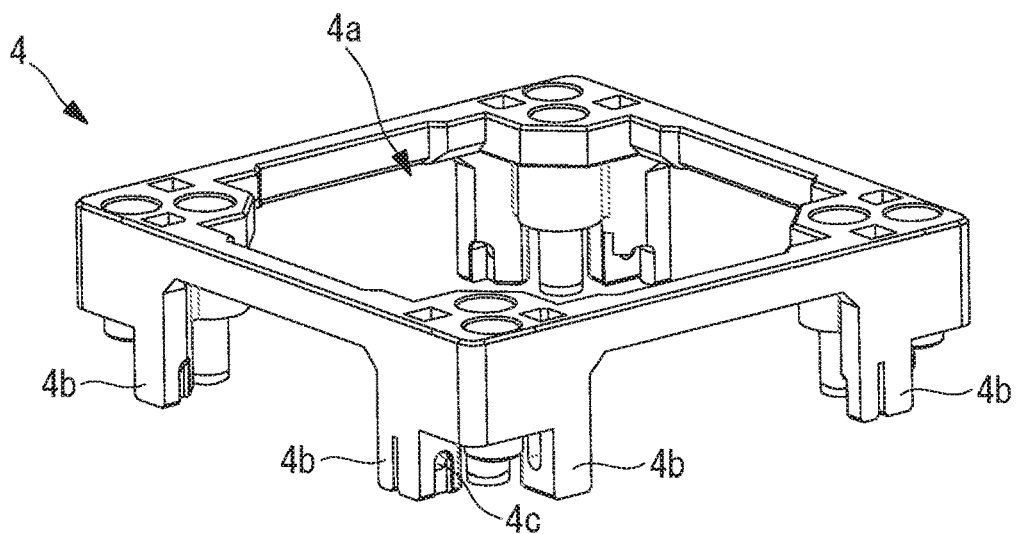
FIG. 11 is a perspective view of a second cover of FIG. 3.

The second cover 4 is shown in FIG. 11.

The second cover 4 is made of resin, and has an outer shape which is square when seen in plan view. A square opening portion 4a is formed at the center portion of the second cover 4 so as to penetrate therethrough in the up-and-down direction. The IC device 1 (see FIG. 1) is inserted from above and taken out through the opening portion 4a.

Guide ribs 4b protruding downward are provided at four corners of the second cover 4. The outer surfaces of the guide ribs 4b are arranged so as to contact the inner surfaces 5f (see FIG. 4A) of the guide portions 5c of the base 5. This allows the second cover 4 to surely move up and down with respect to the base 5 with excellent reproducibility.

Round holes 4c are formed at various places of the second cover 4. The latches 6 are freely turnably fixed to the second cover 4 by inserting the latch pins 10 (see FIG. 3) into the respective round holes 4c.

As described above, the second cover 4 moves up and down while accommodated in the accommodating recess portion 3b (see FIG. 10A) of the first cover 3. The second cover 4 is urged upward from the base 5 by the second coil springs 20 (see FIG. 3).

<Operation of IC Socket 2>

Next, the operation of the IC socket 2 will be described.

In each of the following figures showing the operation of the IC socket 2, figures in which the end of the figure number is represented by "A" (for example, FIG. 12A and the like) are vertically sectional views taken by cutting at positions where the first contact terminal 15a can be seen, and figures in which the end of the figure number is represented by "B" (for example, FIG. 12B) are vertically sectional views taken by cutting at positions where the second contact terminal 16a can be seen. Although the inspection board is not shown in each of the following figures, it is assumed that the IC socket 2 is mounted on the inspection board.

«Free State (Unloaded State)»

Figure 12A:
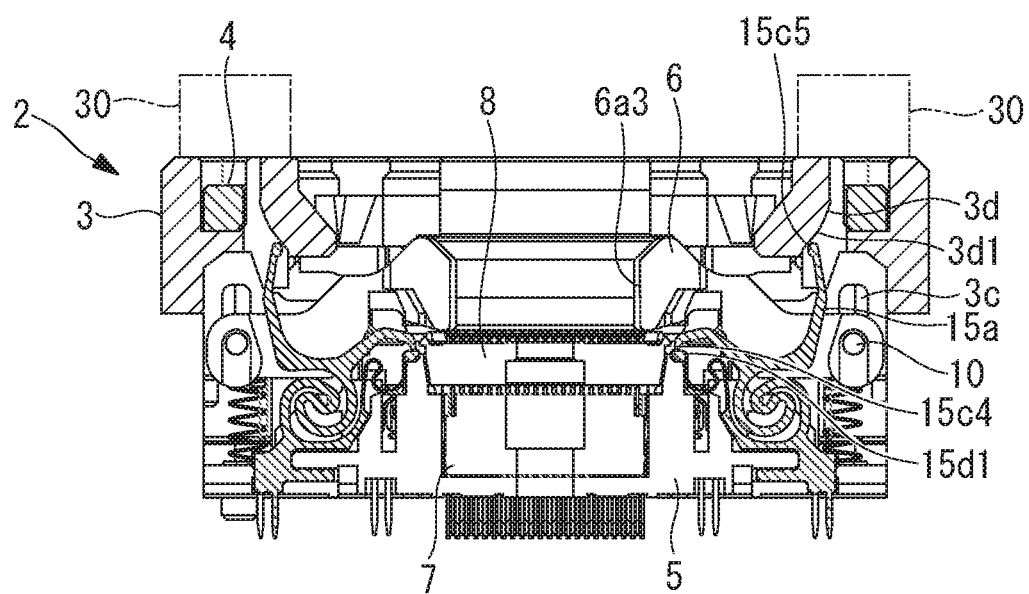
FIG. 12A shows a free state of the IC socket, and is a vertically sectional view on a cutting plane on which the first contact terminals are viewed.
Figure 12B:
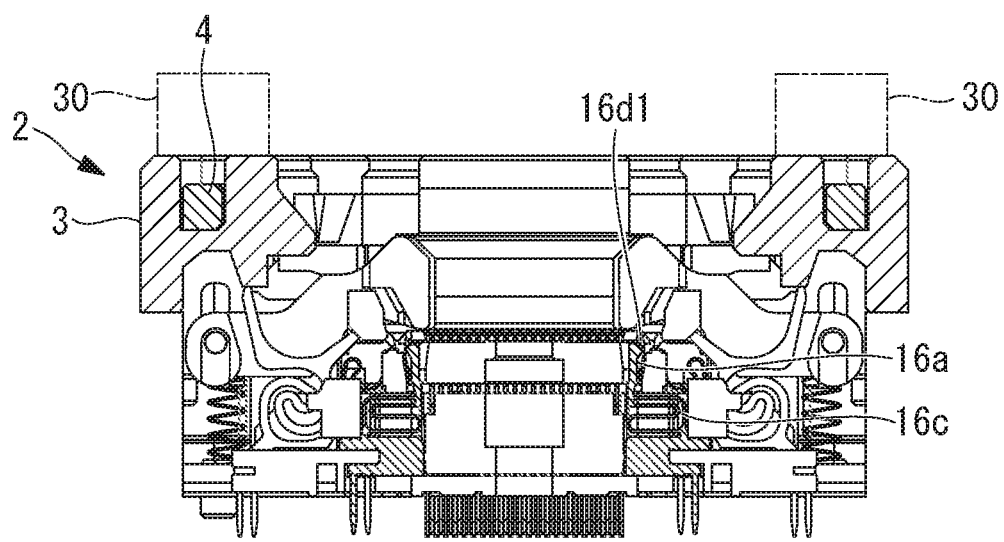
FIG. 12B shows a free state of the IC socket, and is a vertically sectional view on a cutting plane on which the second contact terminals are viewed.

FIGS. 12A and 12B show a free state, that is, a state in which an external force by a pusher 30 is not applied to the IC socket 2. The pusher 30 applies a pressing force to the IC socket 2 from the upper side to the lower side of the IC socket 2, and is set to be vertically moved by an actuator (not shown).

In the free state, the first cover 3 is pushed upward by the first coil springs 19 (see FIG. 3), and the second cover 4 is pushed upward by the second coil springs 20 (see FIG. 3). At this time, the latches 6 are in a closed state (a state where the press portions 6a3 are located at the lower side).

Figure 12C:
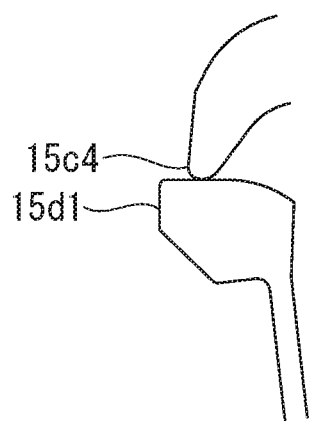
FIG. 12C is a partially enlarged view showing a first upper-side contact and a first lower-side contact.

As shown in FIG. 12A, the sliding portion 15c5 of the first contact terminal 15a is located below the first cam portion 3d1 of the cam portion 3d of the first cover 3. As a result, the first contact terminal 15a is in an unloaded state, and the contacts 15c4 and 15d1 of the first contact terminal 15a are in a close state (see FIG. 12C).

As shown in FIG. 12B, the second contact terminal 16a is in an unloaded state, and the meandering portion 16c has a natural length, so that the second contact 16d1 is located at the upper side.

«Open State»

Figure 13A:
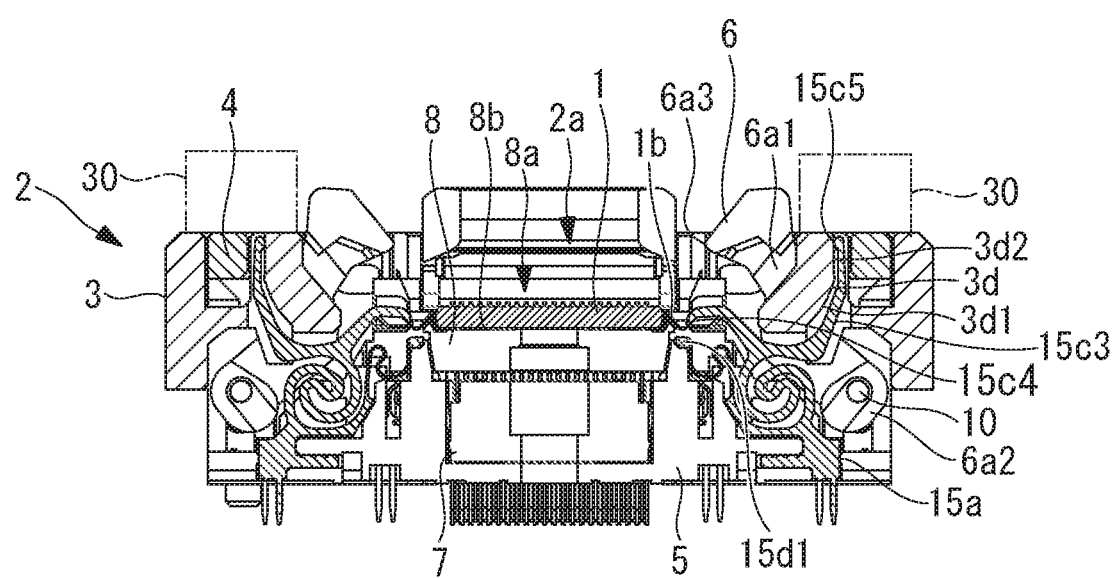
FIG. 13A shows an open state of the IC socket, and is a vertically sectional view on a cutting plane on which the first contact terminals are viewed.
Figure 13B:
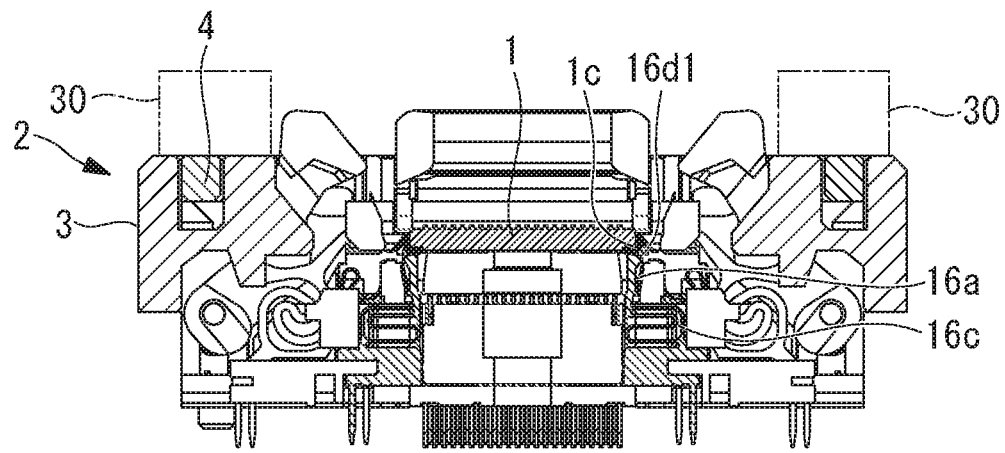
FIG. 13B shows an open state of the IC socket, and is a vertically sectional view on a cutting plane on which the second contact terminals are viewed.

FIGS. 13A and 13B show an open state.

The open state is obtained by pushing down the pusher 30 from the free state to displace the first cover 3 and the second cover 4 downward. In the open state, the first cover 3 and the second cover 4 are in a most depressed state.

By the downward movement of the second cover 4, the guide arms 6a2 of the latches 6 attached to the second cover 4 via the latch pins 10 are also pushed downward. On the other hand, the shaft portions 6b provided to the swing arms 6a1 of the latches 6 move along the guide groove portions 5n (see FIG. 4A) provided to the base 5. As a result, the press portions 6a3 of the latches 6 swing upward, and the latches 6 are set to be opened.

Figure 13C:
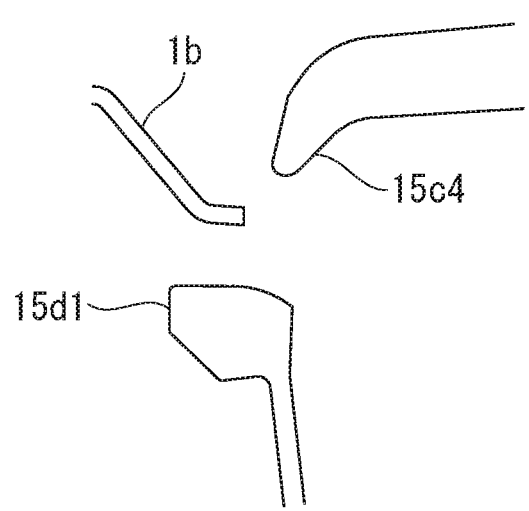
FIG. 13C is a partially enlarged view showing the first upper-side contact and the first lower-side contact.

As shown in FIG. 13A, with respect to the first contact terminal 15a, the first cover 3 is pushed down, whereby the sliding portion 15c5 slides on the cam portion 3d of the first cover 3. The sliding portion 15c5 moves from the first cam portion 3d1 to the second cam portion 3d2, whereby the sliding portion 15c5 is pushed out to the outside of the IC socket 2, and the drive-side arm portion 15c3 turns, so that the first upper-side contact 15c4 is displaced upward and outward. As a result, the first upper-side contact 15c4 retreats from the upper side of the first lower-side contact 15d1 to the outside, so that the first lower-side contact 15d1 appears upward, and the open state of the first contact terminal 15a is obtained (see FIG. 13C).

Figure 13D:
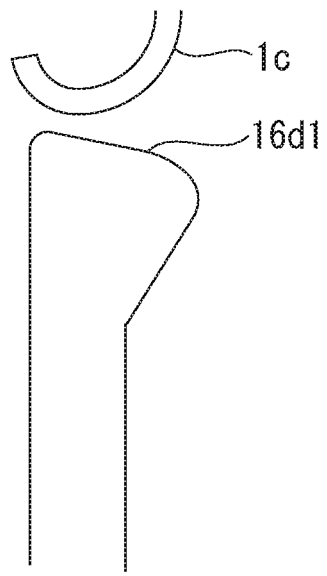
FIG. 13D is a partially enlarged view showing a second contact and a J-type lead terminal.

As shown in FIG. 13B, the second contact terminal 16a is in an unloaded state, and the meandering portion 16c has a natural length, so that the second contact 16d1 is located at the upper side. FIG. 13D shows the positional relationship between the second contact 16d1 and the J-type lead terminal 1c in the open state. As shown in FIG. 13B, the second contact 16d1 and the J-type lead terminal 1c are spaced from each other, and thus are not in contact with each other.

Under such an open state, the IC device 1 is inserted into the accommodating recess portion 2a. As a result, the IC device 1 is placed on the mounting surface 8b of the mounter 8, whereby the IC device 1 is mounted in the mounting recess portion 8a.

«Latch Pressing State»

Figure 14A:
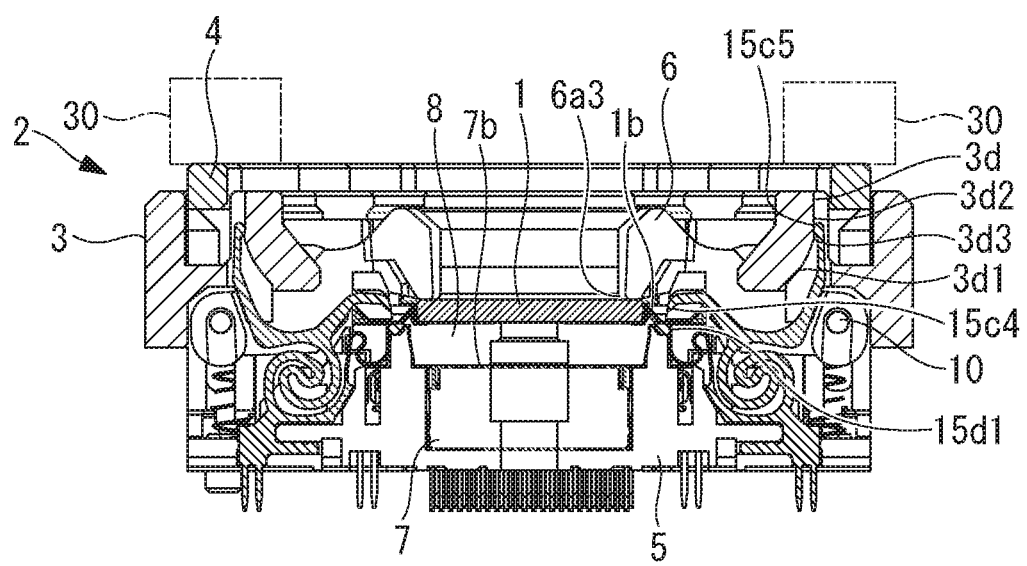
FIG. 14A shows a latch pressing state of the IC socket, and is a vertically sectional view on a cutting plane on which the first contact terminals are viewed.
Figure 14B:
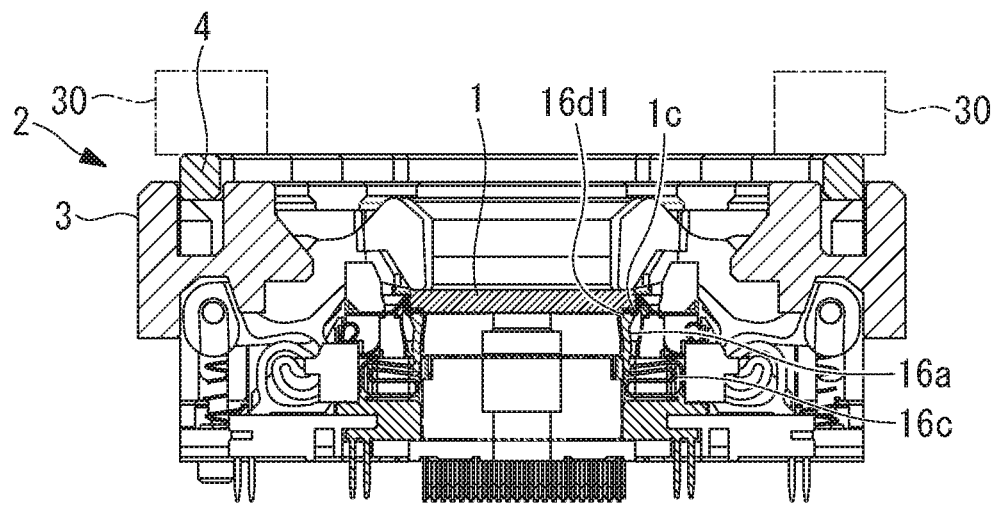
FIG. 14B shows a latch pressing state of the IC socket, and is a vertically sectional view on a cutting plane on which the second contact terminals are viewed.

FIGS. 14A and 14B show a latch pressing state. This latch pressing state is obtained by depressurizing and raising the pusher 30 from the open state. At this time, the position of the pusher 30 is a position between the open state and the free state.

As shown in FIG. 14A, when the pusher 30 is raised, the second cover 4 is moved upward by the elastic restoring force of the second coil springs 20 (see FIG. 3). At this time, the second cover 4 ascends prior to the first cover 3. This is because the sliding portion 15c5 that slides on the cam portion 3d of the first cover 3 engages with the engaging portion 3d3 of the cam portion 3d to suppress ascending of the first cover 3.

Figure 14C:
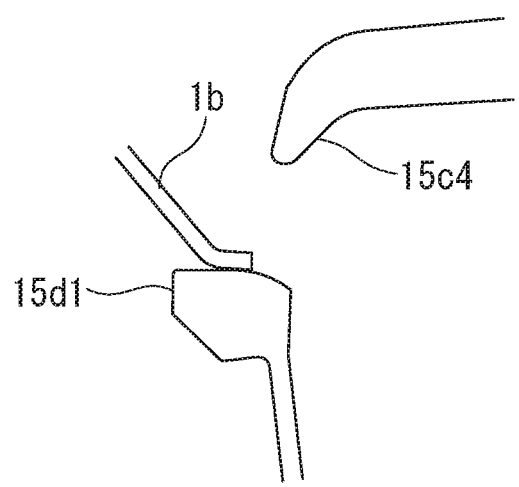
FIG. 14C is a partially enlarged view showing the first upper-side contact and the first lower-side contact.

Since the sliding portion 15c5 is locked to the engaging portion 3d3, the gap between the contacts 15c4 and 15d1 of the first contact terminal 15a remains open as shown in FIG. 14C. Note that as shown in FIG. 14C, the first lower-side contact 15d1 and the gull wing type lead terminal 1b are in contact with each other, but this state is merely a state where the gull wing type lead terminal 1*b* is placed on the first lower-side contact 15*d*1. Therefore, such a contact state as should be obtained under inspection is not obtained.

Since the latch pin 10 ascends in connection with the ascending of the second cover 4, the latch 6 swings around the shaft portion 6*b* (see FIG. 9), and the press portion 6*a*3 of the latch 6 moves downward to press the upper surface (back surface) of the IC socket 2 downward. As a result, the mounter 8 moves downward against the elastic force of the pedestal coil springs 18 (see FIG. 3) and comes into contact with the upper surface 7*b* of the support plate 7, whereby the downward movement of the mounter 8 is stopped.

Figure 14D:
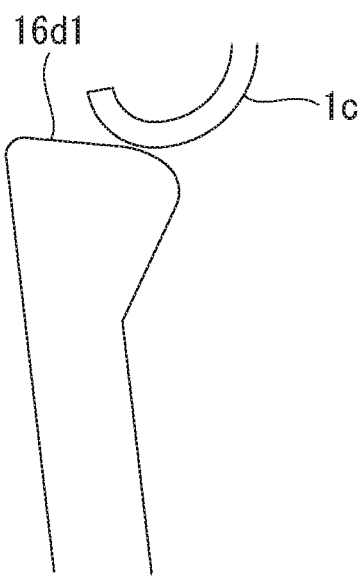
FIG. 14D is a partially enlarged view showing the second contact and the J-type lead terminal.

As shown in FIGS. 14B and 14D, through the above operation, the J-type lead terminal 1*c* of the IC device 1 comes into contact with the second contact 16*d*1, and pushes the second contact 16*d*1 down against the elastic force of the meandering portion 16*c* of the second contact terminal 16*a*, whereby reliable contact can be obtained while wiping.

As described above, under the latch pressing state, the second contact terminal 16*a* first comes into contact with the J-type lead terminal 1*c*, but the first contact terminal 15*a* has not yet pinched the gull wing type lead terminal 1*b* by the first upper-side contact 15*c*4 and the first lower-side contact 15*d*1. In this way, an asynchronous operation is realized between the first contact terminal 15*a* and the second contact terminal 16*a*.

«Inspection State»

Figure 15A:
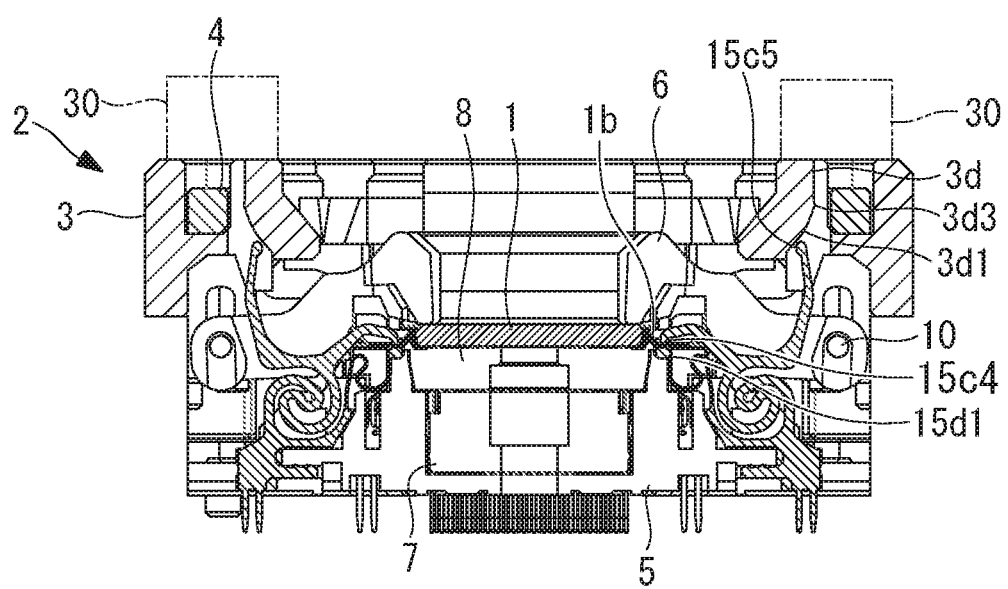
FIG. 15A shows an inspection state of the IC socket, and is a vertically sectional view on a cutting plane on which the first contact terminals are viewed.
Figure 15B:
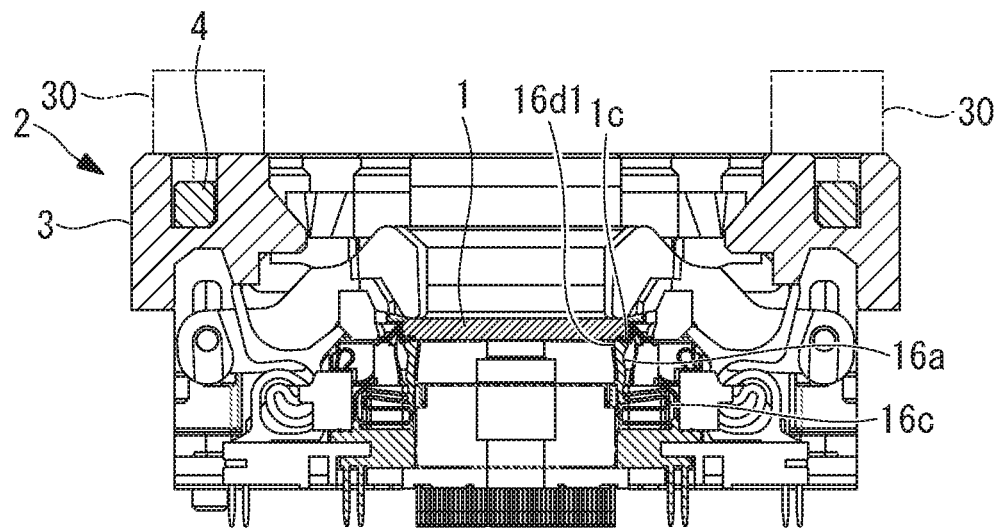
FIG. 15B shows an inspection state of the IC socket, and is a vertically sectional view on a cutting plane on which the second contact terminals are viewed.

A test state is shown in FIGS. 15A and 15B.

Figure 15C:
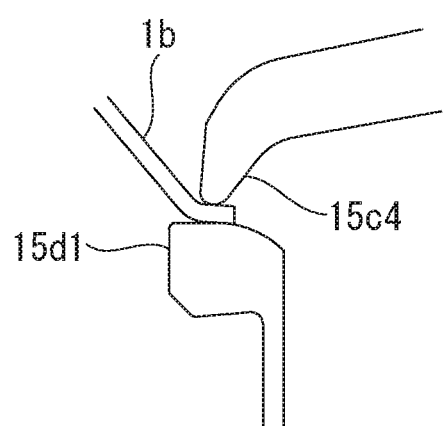
FIG. 15C is a partially enlarged view showing the first upper-side contact and the first lower-side contact.

As shown in FIG. 15A, when the pusher 30 is further raised from the latch pressing state, the latch pin 10 comes into contact with the upper end 3*c*1 (see FIG. 10B) of the elongated hole portion 3*c* of the first cover 3. As a result, the engagement state between the sliding portion 15*c*5 of the first contact terminal 15*a* and the engaging portion 3*d*3 of the cam portion 3*d* is released. The sliding portion 15*c*5 slides on the first cam portion 3*d*1 of the cam portion 3*d* to move to the inside of the IC socket 2, and in connection with this movement, the first upper-side contact 15*c*4 moves downward, whereby the gull wing type lead terminal 1*b* is pinched by the first upper-side contact 15*c*4 and the first lower-side contact 15*d*1 (see FIG. 15C). As a result, the first contact terminal 15*a* and the gull wing type lead terminal 1*b* are electrically connected to each other.

As shown in FIG. 15B, the second contact terminal 16*a* is electrically connected to the J-type lead terminal 1*c* because the IC device 1 has been pushed downward by the latches 6. The connection state between the second contact terminal 16*a* and the J-type lead terminal 1*c* continues from the latch pressing state as shown in FIG. 14D.

Under the above-described inspection state, an inspection such as a predetermined burn-in test is executed on the IC device 1.

«Lead Release State»

Figure 16A:
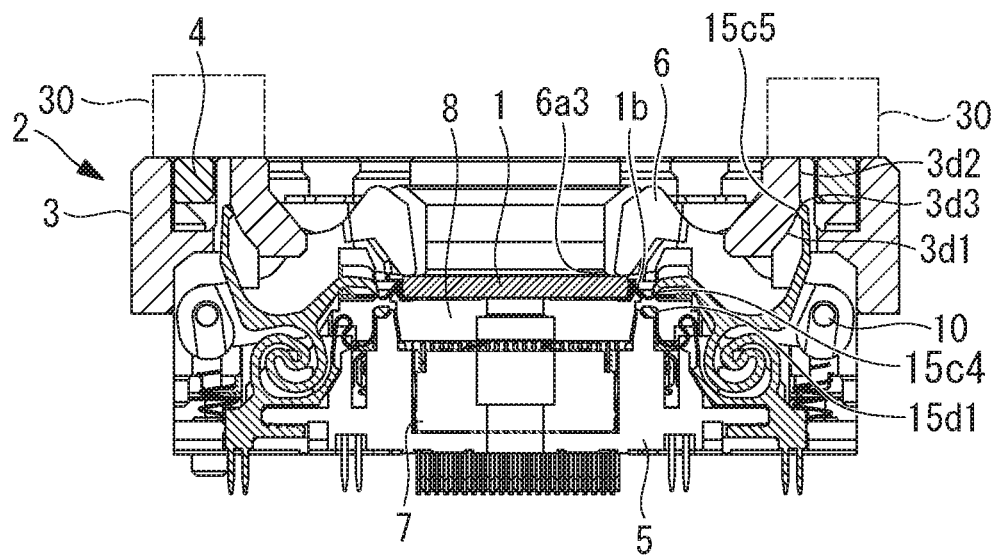
FIG. 16A shows a lead-released state of the IC socket, and is a vertically sectional view on a cutting plane on which the first contact terminals are viewed.
Figure 16B:
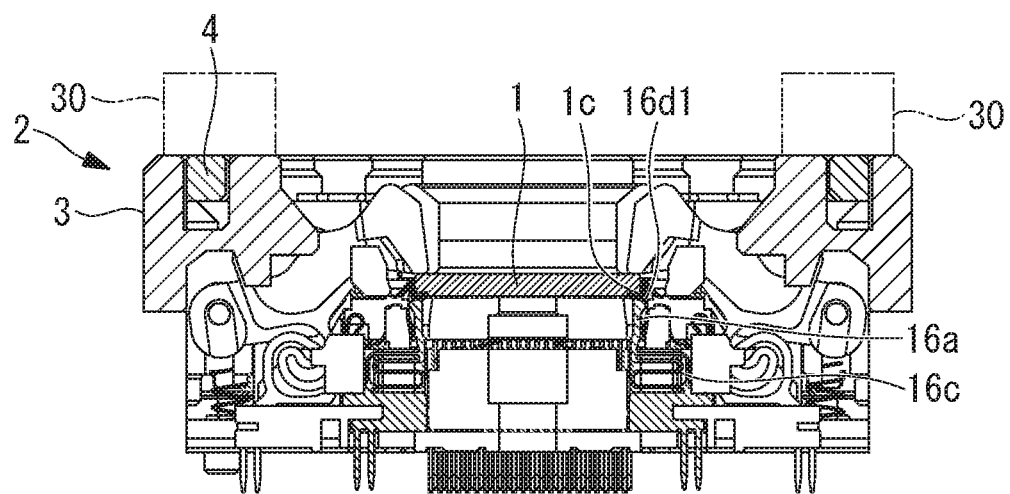
FIG. 16B shows a lead-released state of the IC socket, and is a vertically sectional view on a cutting plane on which the second contact terminals are viewed.

FIGS. 16A and 16B show a lead release state.

When the inspection of IC device 1 is completed under the inspection state, the inspection state shifts to a lead release state. The pusher 30 pushes the first cover 3 downward. The position of the pusher 30 under the lead release state is a position between the inspection state and the open state.

Figure 16C:
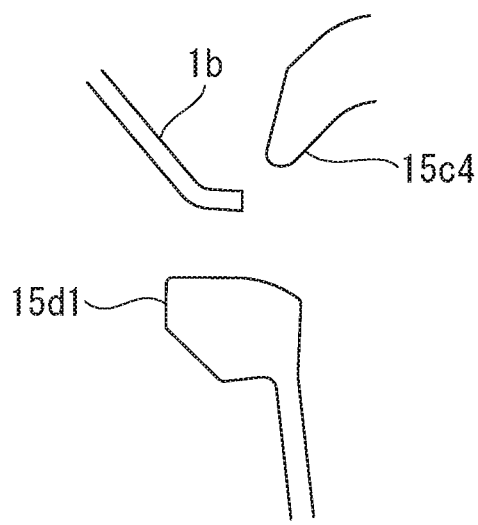
FIG. 16C is a partially enlarged view showing the first upper-side contact and the first lower-side contact.

As shown in FIG. 16A, when the first cover 3 is pushed down, the sliding portion 15*c*5 of the first contact terminal 15*a* ascends while sliding on the first cam portion 3*d*1. As a result, the sliding portion 15*c*5 is expanded to the outside of the IC socket 2, and the first upper-side contact 15*c*4 moves upward and outward. Then, the sliding portion 15*c*5 is locked to the engaging portion 3*d*3. As a result, as shown in FIG. 16C, the contact between the first contact terminal 15*a* and the gull wing type lead terminal 1*b* is released.

As shown in FIG. 16B, the IC device 1 has been pushed downward by the latches 6, and the second contact terminals 16*a* have been close to the J-type lead terminals 1*c*. Note that at this time, the second contact terminals 16*a* may or may not be in contact with the J-type lead terminals 1*c*.

As described above, under the lead release state, the contact between the first contact terminal 15*a* and the gull wing type lead terminal 1*b* is first released, and the latch 6 comes into contact with the upper surface of the IC device 1 to push the IC device 1 downward. In other words, the second contact terminal 16*a* has still been close to the J-type lead terminal 1*c*. In this way, the asynchronous operation is realized between the first contact terminal 15*a* and the second contact terminal 16*a*.

When the pusher 30 is caused to further descend from the lead release state, the open state shown in FIGS. 13A and 13B is set. As a result, the press portion 6*a*3 of the latch 6 retreats upward and outward, so that the tested IC device 1 can be taken out.

The IC device 1 is continuously inspected by repeating the above series of operations.

As described above, the sliding portion 15*c*5 of the first contact terminal 15*a* and the cam portion 3*d* provided to the first cover 3 are provided as a first contact mechanism for bringing the first contact terminal 15*a* into contact with the gull wing type lead terminal 1*b*.

The latches 6 for pressing the upper surface of the IC device 1 downward and the mounter 8 that moves downward according to the pressing force are provided as a second contact mechanism for bringing the second contact terminal 16*a* into contact with the J-type lead terminal 1*c*.

The engaging portion 3*d*3 provided to the cam portion 3*d* and the sliding portion 15*c*5 sliding on the engaging portion 3*d*3 are provided as an asynchronous mechanism for performing an asynchronous operation in which the contact operation of the first contact terminal 15*a* is performed after the contact operation of the second contact terminal 16*a*.

Operation and Effect of the First Embodiment

As described above, according to the present embodiment, the following operation and effect are achieved.

After the second contact terminal 16*a* and the J-type lead terminal 1*c* are brought into contact with each other, the gull wing type lead terminal 1*b* is brought into contact with the first upper-side contact 15*c*4 and the first lower-side contact 15*d*1 of the first contact terminal 15*a* while interposed therebetween. As a result, the first contact terminal 15*a* can be brought into contact with the gull wing type lead terminal 1*b* after the second contact terminal 16*a* is brought into contact with the J-type lead terminal 1*c* to ensure the conduction therebetween. Therefore, even when different types of lead terminals 1*b* and 1*c* are used, the conduction can be surely achieved for the respective lead terminals 1*b* and 1*c*.

Further, before the contact between the second contact terminal 16*a* and the J-type lead terminal 1*c* is released, the first upper-side contact 15*c*4 of the first contact terminal 15*a* which has pinched the gull wing type lead terminal 1*b* is retreated upward to release the contact with the gull wing type lead terminal 1*b*. As a result, the contact state between the gull wing type lead terminal 1*b* and the first contact terminal 15*a* can be first released in the state where the second contact terminal 16*a* is in contact with the J-type lead terminal 1c, so that it can be prevented as much as possible to damage the respective terminals when the contact state is released.

The contact operation of the first contact terminal 15a and the second contact terminal 16a is performed by the first cover 3 and the second cover 4 which approach to and move away from the base 5. As a result, the contact operation of the first contact terminal 15a and the second contact terminal 16a can be performed in conjunction with movements of the first cover 3 and the second cover 4, and an inspection based on a simple operation can be realized.

The second cover 4 can reciprocate while accommodated in the accommodating recess portion 3b (see FIG. 10A) provided in the first cover 3. As a result, the first cover 3 and the second cover 4 can be configured to be compact in size.

Since the back surface of the IC device 1 is pressed by the latches 6, the contact of the second contact terminals 16a can be surely obtained during the inspection. Further, when the IC device 1 is mounted or taken out, a work of replacing the IC device 1 can be facilitated by separating the latches 6 from the IC device 1. Further, since the latches 6 are driven according to the up-and-down movement of the second cover 4, the inspection work can be simplified.

The pressing operation of the latches 6 is performed by the second cover 4, and the second contact terminals 16a are surely brought into contact with the J-type lead terminals 1c. Since the second cover 4 can move with respect to the base 5 independently of the first cover 3, the contact operation of the first contact terminal 15a and the contact operation of the second contact terminal 16a can be made asynchronous.

When the second cover 4 moves downward, the contact between the J-type lead terminal 1c and the second contact terminal 16a is released by the retreating operation of the latches 6. As a result, the contact of the J-type lead terminals 1c can be easily released in conjunction with the movement of the second cover 4.

The cam portion 3d is provided to the first cover 3 that approaches to and moves away from the base 5, and the first contact terminal 15a having the contact-side arm portion 15c2 and the drive-side arm portion 15c3 whose motions are regulated by the cam portion 3d is provided. When the drive-side arm portion 15c3 moves, the first upper-side contact 15c4 driven by the contact-side arm portion 15c2 approaches the first lower-side contact 15d1. As a result, the gull wing type lead terminal 1b can be pinched by the first upper-side contact 15c4 and the first lower-side contact 15d1, so that a good contact state can be obtained.

By causing the drive-side arm portion 15c3 to move according to the cam portion 3d, the first upper-side contact 15c4 driven by the contact-side arm portion 15c2 can be moved away from the first lower-side contact 15d1. As a result, the first upper-side contact 15c4 can be smoothly separated from the gull wing type lead terminal 1b.

When the sliding portion 15c5 of the contact-side arm portion 15c2 for causing the first upper-side contact 15c4 of the first contact terminal 15a to move comes into contact with the engaging portion 3d3 provided to the cam portion 3d, the movement of the drive-side arm portion 15c3 is temporarily delayed. As a result, the pressing operation of the latch 6 can realize the asynchronous operation of performing the contact operation of pinching the gull wing type lead terminal 1b by the first upper-side contact 15c4 and the first lower-side contact 15d1 after the J-type lead terminal 1c is brought into contact with the second contact terminal 16a.

The first cam portion 3d1 and the second cam portion 3d2 are provided so as to interpose the engaging portion 3d3 therebetween, and the first cam portion 3d1 regulates an operation in which the first upper-side contact 15c4 approaches to or moves away from the first lower-side contact 15d1 while the second cam portion 3d2 regulates an operation of keeping a state where the first upper-side contact 15c4 is separated from the first lower-side contact 15d1. As a result, the open state and the closing operation of the first upper-side contact 15c4 can be clearly separated from each other, and the asynchronous operation can be reliably performed.

Note that the engaging portion 3d3 is used at the cam portion 3d in the present embodiment, but the present invention is not limited to this style. For example, even if the engaging portion 3d3 is omitted and the first cam portion 3d1 and the second cam portion 3d2 are smoothly connected to each other at the connection portion therebetween, the surface of this connection portion may be roughened so as to generate a larger frictional force than the other cam portions 3d. By providing the roughened connection portion as described above, resistance can be applied to the sliding operation of the sliding portion 15c5, and an asynchronous operation similar to that in the case of the engaging portion 3d3 can be realized.

Second Embodiment

A second embodiment of the present invention will be described below.

The present embodiment differs from the first embodiment in use of probe pins for the first contact terminal and the second contact terminal and in a mechanism for driving the first contact terminal. Therefore, in the following description, differences from the first embodiment will be mainly described, and description of other common matters will be omitted.

Figure 17:
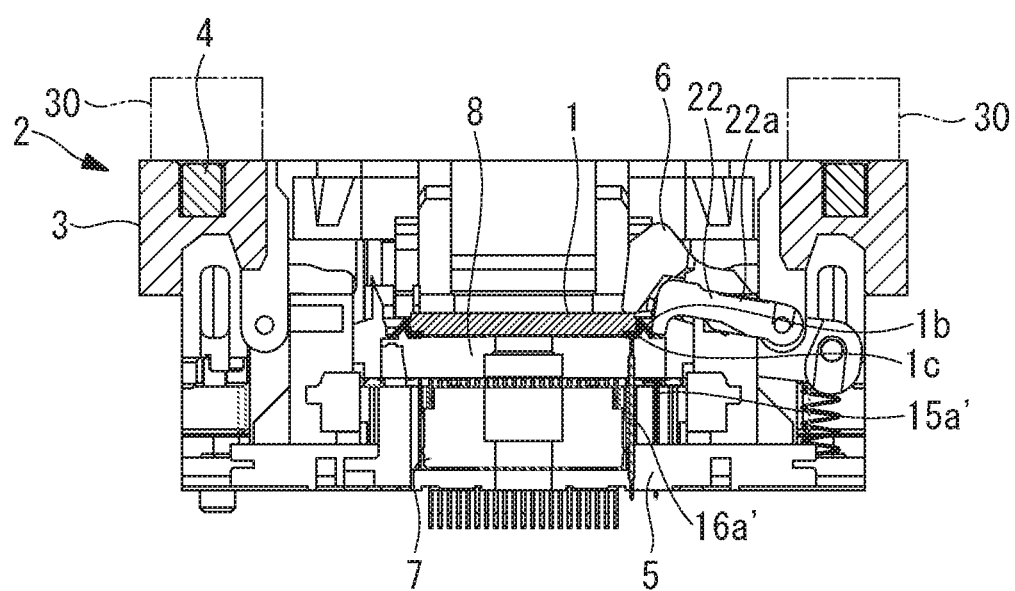
FIG. 17 is a vertically sectional view showing an IC socket according to a second embodiment of the present invention.

As shown in FIG. 17, probe pins are provided for a first contact terminal 15a' and a second contact terminal 16a'. The probe pin is of a plunger type, and has a compression spring inside a cylindrical barrel. A pin which is capable of protruding from and retracting into the cylindrical barrel is urged upward by the compression spring.

The latch 6 operates in the same manner as in the case of the first embodiment, and the J-type lead terminal 1c and the second contact terminal 16a' are brought into contact with each other by pressing the upper surface of the IC device 1 downward. In other words, the lower portion of the J-type lead terminal 1c presses the upper portion of the second contact terminal 16a', thereby performing reliable contact therebetween.

A first terminal latch 22 is turnably fixed to the first cover 3. The first terminal latch 22 has a shape similar to that of the latch 6 shown in FIG. 9. A shaft portion (not shown, corresponding to the shaft portion 6b in FIG. 9) provided to a swing arm 22a of the first terminal latch 22 is inserted into a first terminal guide groove portion formed in the base 5. Although not shown, the first terminal groove portion has a shape corresponding to that of the guide groove portion 5n shown in FIG. 4A, and is formed below the guide groove portion 5n.

The first terminal latch 22 swings in the same manner as the latch 6 in accordance with the movement of the first cover 3, and presses the upper surface of the gull wing type lead terminal 1b downward, whereby the gull wing type lead terminal 1b is pinched by the first terminal latch 22 and the first contact terminal 15a' between them to surely perform the contact. In other words, the lower portion of the gull wing type lead terminal 1b and the upper portion of the first contact terminal 15a' come into contact with each other to establish conduction.

Since the upper surfaces of the first cover 3 and the second cover 4 that contact the pusher 30 are different in height, the operation timings of the first terminal latch 22 and the latch 6 can be made different from each other. As a result, the timing at which the gull wing type lead terminal 1b is pinched by the first terminal latch 22 and the first contact terminal 15a' between them and the timing at which the second contact terminal 16a' contacts the J-type lead terminal 1c can be made different from each other, and the asynchronous operation can be realized.

Third Embodiment

A third embodiment of the present invention will be described below. The present embodiment differs from the first embodiment in that the contact manner of the first contact terminal is set to a one-side contact manner. Note that the description of configurations similar to those of the first embodiment will be omitted.

Figure 18:
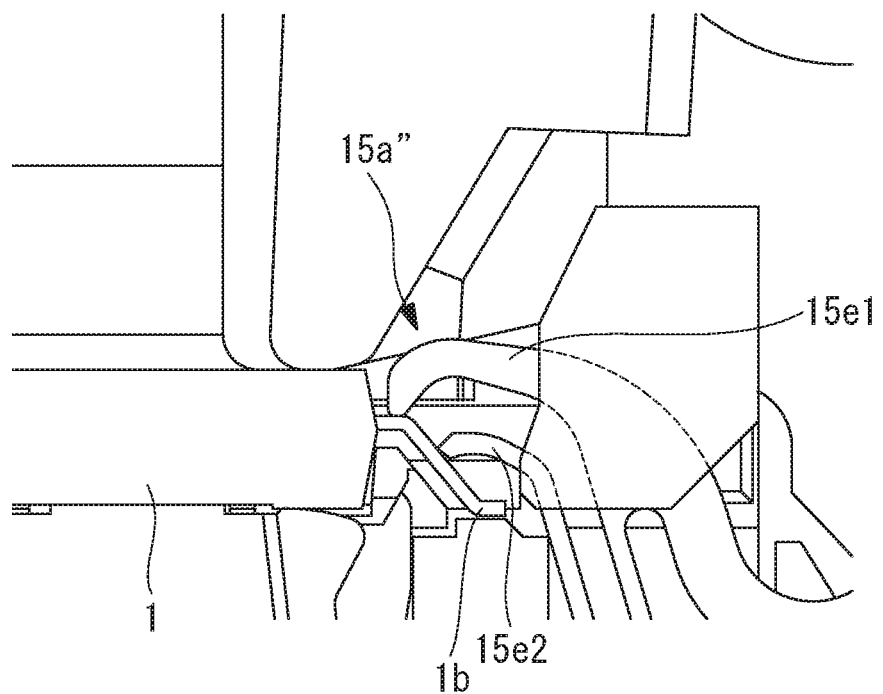
FIG. 18 is a partial vertically sectional view showing a main part of an IC socket according to a third embodiment of the present invention.

As shown in FIG. 18, a first contact terminal 15" of the present embodiment includes two independent upper-side contact portions 15e1 and 15e2 branched from one base portion. Therefore, the first contact terminal 15" does not include the lower contact portion 15d described with reference to FIG. 5 in the first embodiment.

The one first upper-side contact portion 15e1 comes into contact with a part of the gull wing type lead terminal 1b of the IC device 1 (a root portion on the left side in FIG. 18) from above. The other second upper-side contact portion 15e2 comes into contact with another part of the gull wing type lead terminal 1b (an inclined portion on the right side in FIG. 18) from above. As described above, the two upper-side contact portions 15e1 and 15e2 may be brought into contact with one gull wing type lead terminal 1b from the same sides (that is, from above).

Note that the method of making the operation timings of the first terminal latch 22 and the latch 6 different is not limited to the above method, and any method may be used as long as it makes the operation timings of the first cover 3 and the second cover 4 different.

REFERENCE SIGNS LIST

1 IC device (inspection device)
1a package main body
1b gull wing type lead terminal (first lead terminal)
1c J-type lead terminal (second lead terminal)
2 IC socket (socket for inspection)
2a accommodating recess portion
3 first cover
3a opening portion
3b accommodating recess portion (second cover accommodating portion)
3c elongated hole portion
3c1 upper end
3c2 lower end
3d cam portion (first contact mechanism)
3d1 first cam portion
3d2 second cam portion
3d3 engaging portion (movement resistance portion, asynchronous mechanism)
4 second cover
4a opening portion
4b guide rib
4c round hole
5 base
5a mounting surface
5b projection
5c guide portion
5d top portion (of guide portion)
5e outer surface
5f inner surface
5g first coil spring insertion hole
5h second coil spring insertion hole
5i base opening portion
5j first contact holding portion
5k second contact holding portion
5l locking hole
5m guide hole portion
5n guide groove portion
6 latch (second contact mechanism)
6a frame body
6a1 swing arm
6a2 guide arm
6a3 press portion
6b shaft portion
6c pin insertion hole
7 support plate
7a locking claw
7b upper surface
7b1 convex portion
8 mounter (second contact mechanism)
8a mounting recess portion
8b mounting surface
8c guide portion
8d claw portion
10 latch pin
11 E-ring
13 rivet
15 first contact terminal group
15a, 15a', 15a" first contact terminal
15b base portion
15b1 first board-side terminal
15c upper contact portion
15c1 eddy portion
15c2 contact-side arm portion
15c3 drive-side arm portion
15c4 first upper-side contact (other-surface-side contact portion)
15c5 sliding portion (first contact mechanism, asynchronous mechanism)
15d lower contact portion
15d1 first lower-side contact (one-surface-side contact portion)
15e1 first upper-side contact portion
15e2 second upper-side contact portion
16 second contact terminal group
16a, 16a' second contact terminal
16b base portion
16b1 second board-side terminal
16c meandering portion
16d second contact portion
16d1 second contact
18 pedestal coil spring
19 first coil spring
20 second coil spring
22 first terminal latch
22a swing arm
30 pusher
O1 center

The invention claimed is:

1. A socket for inspection comprising:
   a first contact terminal that is configured to be in contact with a first lead terminal of an inspection device;
   a second contact terminal that is configured to be in contact with a second lead terminal of the inspection device, the second lead terminal being different in type from the first lead terminal;
   a first contact mechanism that is configured to bring the first contact terminal into contact with the first lead terminal;
   a second contact mechanism that is configured to bring the second contact terminal into contact with the second lead terminal; and
   an asynchronous mechanism that is configured to perform an asynchronous operation in which a contact operation by the first contact mechanism is performed after a contact operation by the second contact mechanism.

2. The socket for inspection according to claim 1, wherein the asynchronous mechanism releases the contact by the first contact mechanism before releasing the contact by the second contact mechanism.

3. The socket for inspection according to claim 1, further comprising:
   a base that is provided on a mount side on which the inspection device is accommodated;
   a first cover that is provided so as to approach to and move away from the base; and
   a second cover that is provided so as to approach to and move away from the base independently of the first cover, wherein
   the first contact mechanism and the second contact mechanism are driven according to movements of the first cover and the second cover.

4. The socket for inspection according to claim 3, wherein the first cover includes a second cover accommodating portion that is configured to accommodate the second cover therein.

5. The socket for inspection according to claim 3, further comprising a latch reciprocating between a press position where a back surface opposite to a mount surface of the inspection device is pressed in a direction to the mount surface, and a separation position where the latch is separated from the inspection device, wherein
   according to the movement of the first cover and/or the second cover, the latch is located at the press position when the inspection device is inspected, and is located at the separation position when the inspection device is mounted or taken out.

6. The socket for inspection according to claim 5, wherein the latch is operated by the second cover, and
   the second contact mechanism performs a contact operation upon placement of the latch at the press position.

7. The socket for inspection according to claim 6, wherein the latch releases the contact between the second lead terminal and the second contact terminal upon placement of the latch at the separation position.

8. The socket for inspection according to claim 3, wherein the first contact terminal includes a one-surface-side contact portion configured to be in contact with one surface side of the first lead terminal, an other-surface-side contact portion configured to be in contact with another surface side of the first lead terminal, and an arm portion that is configured to cause the other-surface-side contact portion to approach the one-surface-side contact portion so as to pinch the first lead terminal,
   the first cover includes a cam portion that contacts the arm portion and regulates movement of the arm portion, and
   the first contact mechanism performs a contact operation by the arm portion operating according to the cam portion in connection with movement of the first cover with respect to the base.

9. The socket for inspection according to claim 8, wherein
   the arm portion is driven so that the other-surface-side contact portion which pinches the first lead terminal is moved away from the one-surface-side contact portion, thereby releasing the contact, and
   the first contact mechanism releases the contact by the arm portion operating according to the cam portion in connection with movement of the first cover with respect to the base.

10. The socket for inspection according to claim 8, wherein any one of the one-surface-side contact portion and the other-surface-side contact portion is formed of a conductor, and the other is formed of resin.

11. The socket for inspection according to claim 8, wherein
    the cam portion includes a movement resistance portion that is configured to increase a movement resistance of the arm portion operating in contact with the cam portion, and
    the asynchronous mechanism causes the asynchronous operation to be performed upon contact of the arm portion with the movement resistance portion.

12. The socket for inspection according to claim 11, wherein the cam portion includes a first cam portion that is configured to regulate an operation in which the other-surface-side contact portion approaches to or moves away from the one-surface-side contact portion, and a second cam portion that is configured to regulate an operation in which a state where the other-surface-side contact portion is separated from the one-surface-side contact portion is kept, the movement resistance portion being interposed between the first cam portion and the second cam portion.

13. The socket for inspection according to claim 6, further comprising a first terminal latch configured to press the first contact terminal so as to bring the first contact terminal into contact with the first lead terminal according to movement of the first cover, wherein
    the first terminal latch serves as the first contact mechanism to bring the first contact terminal into contact with the first lead terminal.

14. The socket for inspection according to claim 13, wherein the first terminal latch releases the contact between the first lead terminal and the first contact terminal according to the movement of the first cover.

\* \* \* \* \*